US012796245B2

(12) United States Patent
Zhang

(10) Patent No.: US 12,796,245 B2
(45) Date of Patent: Nov. 10, 2026

(54) DISPLAY PANEL WITH COMPENSATION STRUCTURES, METHOD FOR REPAIRING DISPLAY PANEL, AND DISPLAY APPARATUS

(71) Applicants: WUHAN TIANMA MICROELECTRONICS CO., LTD., Wuhan (CN); Wuhan Tianma Microelectronics Co., Ltd. Shanghai Branch, Shanghai (CN)

(72) Inventor: Mengmeng Zhang, Wuhan (CN)

(73) Assignees: WUHAN TIANMA MICROELECTRONICS CO., LTD., Wuhan (CN); WUHAN TIANMA MICROELECTRONICS CO., LTD. Shanghai Branch, Shanghai (CN)

( * ) Notice: Subject to any disclaimer, the term of this patent is extended or adjusted under 35 U.S.C. 154(b) by 953 days.

(21) Appl. No.: 17/696,767

(22) Filed: Mar. 16, 2022

(65) Prior Publication Data

US 2022/0246711 A1 Aug. 4, 2022

(30) Foreign Application Priority Data

Dec. 29, 2021 (CN) ......................... 202111638276.9

(51) Int. Cl.
*H10K 59/131* (2023.01)
*H10K 59/121* (2023.01)
*H10K 59/88* (2023.01)

(52) U.S. Cl.
CPC ....... *H10K 59/131* (2023.02); *H10K 59/1213* (2023.02); *H10K 59/1216* (2023.02); *H10K 59/88* (2023.02)

(58) Field of Classification Search
CPC ............. H10K 59/131; H10K 59/1213; H10K 59/1216; H10K 59/88; H10K 71/861
See application file for complete search history.

(56) References Cited

U.S. PATENT DOCUMENTS

2014/0027728 A1* 1/2014 Yoon ...................... H10K 71/00 438/34
2015/0102312 A1* 4/2015 Lee ........................ H10K 59/88 257/40

(Continued)

FOREIGN PATENT DOCUMENTS

CN 105845082 A 8/2016
CN 109216425 A 1/2019

(Continued)

OTHER PUBLICATIONS

Chinese First Office Action (with English translation) mailed Mar. 20, 2025 and received for Chinese Application No. 202111638276.9, filed Dec. 29, 2021, 25 pages total.

*Primary Examiner* — Jacob Y Choi
*Assistant Examiner* — Grace Cha
(74) *Attorney, Agent, or Firm* — Christensen O'Connor Johnson Kindness PLLC

(57) ABSTRACT

A display panel, a method for repairing the same, and a display apparatus are provided. The display panel includes pixels, signal lines, and pixel repair structures. The pixel includes a first pixel circuit and a light-emitting device. The signal line extends in a first direction and is coupled to the first pixel circuit. The pixel repair structures include second pixel circuits, first and second repair assemblies, and first compensation structures. The first compensation structures and the signal lines are in one-to-one correspondence. The first repair assembly partially overlaps at least one signal line. The second repair assembly partially overlaps at least one light-emitting device. The first repair assembly includes a first repair line coupled to a first input terminal of the second pixel circuit. An output terminal of the second pixel circuit is coupled to at least one second repair line of at least one second repair assembly.

28 Claims, 22 Drawing Sheets

(56) References Cited

U.S. PATENT DOCUMENTS

| | | | | |
|---|---|---|---|---|
| 2015/0109189 A1* | 4/2015 | Hwang | ................ | G09G 3/3225 345/78 |
| 2015/0294618 A1* | 10/2015 | Park | ..................... | G09G 3/3291 345/78 |
| 2016/0218155 A1* | 7/2016 | Park | ..................... | H10K 59/131 |
| 2021/0173269 A1* | 6/2021 | Li | ......................... | G02F 1/1368 |

FOREIGN PATENT DOCUMENTS

| | | | |
|---|---|---|---|
| CN | 109560111 | A | 4/2019 |
| CN | 113066807 | A | 7/2021 |

* cited by examiner

DISPLAY PANEL WITH COMPENSATION STRUCTURES, METHOD FOR REPAIRING DISPLAY PANEL, AND DISPLAY APPARATUS

CROSS-REFERENCE TO RELATED APPLICATIONS

The present application claims priority to Chinese Patent Application No. 202111638276.9, filed on Dec. 29, 2021, the content of which is incorporated herein by reference in its entirety.

TECHNICAL FIELD

The present disclosure relates to the technical field of display, and in particular, to a display panel, a method for repairing the display penal, and a display apparatus.

BACKGROUND

The organic light-emitting diode (OLED) is a device that uses a multi-layer organic film structure to generate electroluminescence. The OLED is easy to manufacture and can be driven with a low voltage. Compared with the liquid crystal displays, the OLED displays are lighter and thinner and have high brightness, low power consumption, fast response, high definition, good flexibility, and high luminous efficiency, which can meet the new demands of consumers for the display technology. Pixel circuits are provided in the display panel to drive the OLED device to emit light. If there is a defect in a pixel circuit, a corresponding OLED device cannot be lit, resulting in a display defect in the display panel and affecting the display effect.

SUMMARY

According to a first aspect, an embodiment of the present disclosure provides a display panel. The display panel includes a substrate, pixels, signal lines, and pixel repair structures. The pixels and the signal lines are located at a side of the substrate, at least one of the pixels includes a first pixel circuit and a light-emitting device, at least one of the signal lines extends in a first direction, and the signal lines are coupled to the first pixel circuits of the pixels. The pixel repair structures include second pixel circuits, at least one first repair assembly, at least one second repair assembly, and first compensation structures. The first compensation structures are in a one-to-one correspondence with the signal lines. In a direction perpendicular to a plane of the substrate, one of the at least one first repair assembly partially overlaps at least one signal line of the signal lines, and one of the at least one second repair assembly partially overlaps at least one of the light-emitting devices of the pixels. The at least one first repair assembly includes a first repair line, and the at least one second repair assembly includes at least one second repair line. One of the second pixel circuits includes a first input terminal coupled to the first repair line, and an output terminal that is coupled to at least one of the at least one second repair line.

According to a second aspect, an embodiment of the present disclosure further provides a display apparatus including a display panel. The display panel includes pixels, signal lines, and pixel repair structures. The pixels and the signal lines are located at a side of the substrate, at least one of the pixels includes a first pixel circuit and a light-emitting device, at least one of the signal lines extends in a first direction, and the signal lines are coupled to the first pixel circuits of the pixels. The pixel repair structures include second pixel circuits, at least one first repair assembly, at least one second repair assembly, and first compensation structures. The first compensation structures are in a one-to-one correspondence with the signal lines. In a direction perpendicular to a plane of a substrate, one of the at least one first repair assembly partially overlaps at least one signal line of the signal lines, and one of the at least one second repair assembly partially overlaps at least one of the light-emitting devices of the pixels. The at least one first repair assembly includes a first repair line, and the at least one second repair assembly includes at least one second repair line. One of the second pixel circuits includes a first input terminal coupled to the first repair line, and an output terminal that is coupled to at least one of the at least one second repair line.

According to a third aspect, an embodiment of the present disclosure provides a method for repairing a display panel. The method includes:

- performing defect detection on a display panel, where the display panel includes a substrate, pixels, signal lines, and pixel repair structures; the pixels and signal lines are located at a side of the substrate, at least one of the pixels includes a first pixel circuit and a light-emitting device, at least one of the signal lines extends in a first direction, and the signal lines are coupled to the first pixel circuits of the pixels; the pixel repair structures includes second pixel circuits, at least one first repair assembly, at least one second repair assembly, and first compensation structures; the first compensation structures are in a one-to-one correspondence with the signal lines; in a direction perpendicular to a plane of the substrate, one of the at least one first repair assembly partially overlaps at least one signal line of the signal lines, and one of the at least one second repair assembly partially overlaps at least one of the light-emitting devices of the pixels; the at least one first repair assembly includes a first repair line, and the at least one second repair assembly includes at least one second repair line; and one of the second pixel circuits includes a first input terminal coupled to the first repair line, and an output terminal coupled to at least one of the at least one second repair line;
- determining a location of a defective pixel of the pixels based on a defect detection result, wherein the first pixel circuit of the defective pixel is a defective pixel circuit; and
- configuring the display panel based on the location of the defective pixel. The configuring the display panel based on the location of the defective pixel includes: disconnecting a repair signal line from one of the first compensation structures that is coupled to the repair signal line, wherein one of the signal lines that is electrically connected to the defective pixel circuit is the repair signal line; coupling the first repair line to the repair signal line; coupling one of the at least one second repair line to the light-emitting device of the defective pixel.

BRIEF DESCRIPTION OF DRAWINGS

In order to more clearly explain the embodiments of the present disclosure or the technical solution in the related art, the drawings used in the description of the embodiments or the related art will be briefly described below. The drawings in the following description are some embodiments of the present disclosure. Those skilled in the art can obtain other drawings based on these drawings.

DESCRIPTION OF EMBODIMENTS

In order to better understand technical solutions of the present disclosure, the embodiments of the present disclosure are described in detail with reference to the drawings. It should be clear that the described embodiments are merely part of the embodiments of the present disclosure rather than all of the embodiments. It is obvious for those skilled in the art that other embodiments made based on the embodiments of the present disclosure fall within the protection scope of the present disclosure.

The terms used in the embodiments of the present disclosure are merely for the purpose of describing specific embodiment, rather than limiting the present disclosure. The terms “a”, “an”, “the”, and “said” in a singular form in the embodiments of the present disclosure and the attached claims are also intended to include plural forms thereof, unless noted otherwise.

Figure 1:
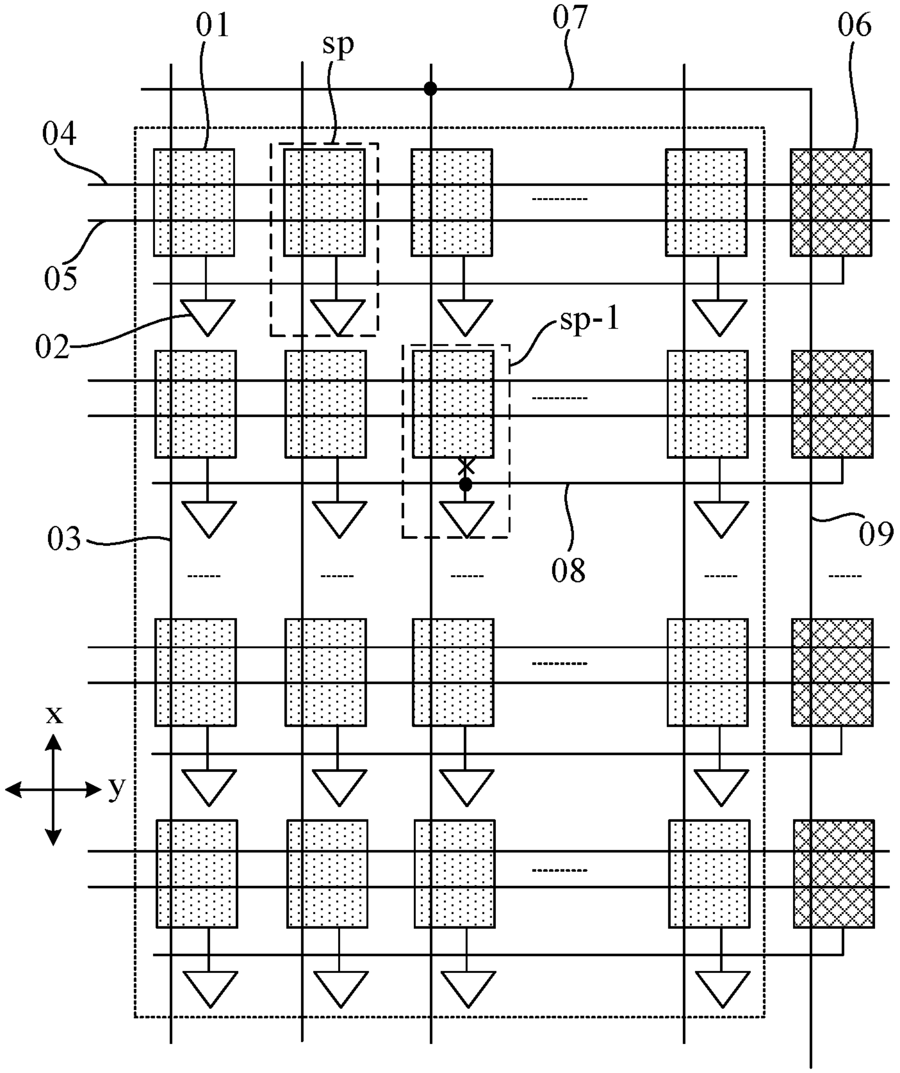
FIG. 1 is a schematic diagram of a display panel in the related art.

FIG. 1 is a schematic diagram of a display panel in the related art. As shown in FIG. 1, the display panel includes multiple pixels sp, the pixel sp includes a pixel circuit 01 and a light-emitting device 02 that are coupled to each other. FIG. 1 further illustrates data lines 03, scanning lines 04, and light-emitting control lines 05 in the display panel. The data line 03 is coupled to multiple pixel circuits 01 arranged in a column direction x, the scanning line 04 is coupled to multiple pixel circuits 01 arranged in a row direction y, and the light-emitting control line 05 is coupled to multiple pixel circuits 01 arranged in the row direction y. Pixel repair circuits 06 are provided in the display panel, one pixel repair circuit 06 is correspondingly provided for each row of pixel circuits, the pixel repair circuit 06 is coupled to the corresponding scanning line 04 and the light-emitting control line 05, and multiple pixel repair circuits 06 arranged in the column direction x are connected to a same repair line 09. A data input terminal of the pixel repair circuit 06 is coupled to the repair line 09, the repair line 09 is coupled to a first connection line 07 extending in the row direction y, and an output terminal of the pixel repair circuit 06 is coupled to a second connection line 08.

When a pixel circuit 01 in a pixel sp is defective, the pixel repair circuit 06 is coupled to a data line 03 corresponding to the defective pixel through the first connection line 07, and the pixel repair circuit 06 is coupled to a light-emitting device 02 in the defective pixel through the second connection line 08, such that the pixel repair circuit 06 drives the light-emitting device 02 of the defective pixel to emit light. FIG. 1 schematically illustrates a defective pixel sp-1. For example, if a pixel circuit 01 (2, 3) in a third column and a second row is defective, the pixel circuit 01 (2, 3) cannot drive a corresponding light-emitting device 02 to emit light. In this case, the first connection line 07 is coupled to a data line 03 corresponding to the pixel circuit 01 (2, 3), the light-emitting device 02 corresponding to the pixel circuit 01 (2, 3) is coupled to a second connection line 08, and the pixel repair circuit 06 provides a drive signal to the light-emitting device 02 through the second connection line 08, to drive the light-emitting device 02 to emit light, thereby repairing the defective pixel sp-1 to make it operate normally.

When the defective pixel sp-1 in the display panel is repaired with the above method, the first connection line 07 is coupled to the data line 03 corresponding to the defective pixel sp-1, which generates a large parasitic capacitance on the data line 03. Parasitic capacitance is generated between the first connection line 07 and the data line 03 overlapping the first connection line 07, and parasitic capacitance is also generated between the repair line 09 and multiple scanning lines 04 overlapping the repair line 09, and also generated between the repair line 09 and multiple light-emitting control lines 05 overlapping the repair line 09, which greatly increase load on the data line 03 corresponding to the defective pixel sp-1. In other words, when using the pixel repair circuit 06 to drive the light-emitting device 02 to emit light, the parasitic capacitance on the data line 03 corresponding to the defective pixel sp-1 is much greater than parasitic capacitance on a normal data line 03, resulting in a large difference in data signal transmission. In this way, a difference in the display brightness between a pixel corresponding to the data line 03 electrically connected to the defective pixel sp-1 and a pixel corresponding to the normal data lines 03 is generated, which affects the display effect.

In order to resolve the above problem, an embodiment of the present disclosure provides the display panel to pre-compensate the capacitance of the signal lines using compensation structures. When the defective pixel is repaired, a pixel repair structure is used to drive the light-emitting device of the defective pixel to emit light, and the coupling between the signal line corresponding to the defective pixel and a corresponding compensation structure is disconnected. When a capacitance value compensated by the compensation structure is set to be basically the same as a parasitic capacitance value introduced by the pixel repair structure, the parasitic capacitance on the signal line corresponding to the defective pixel is basically the same as the parasitic capacitance on the normal signal line. In this way, the delay on the signal lines is basically the same and the display effect of the repaired display panel is improved.

Figure 2:
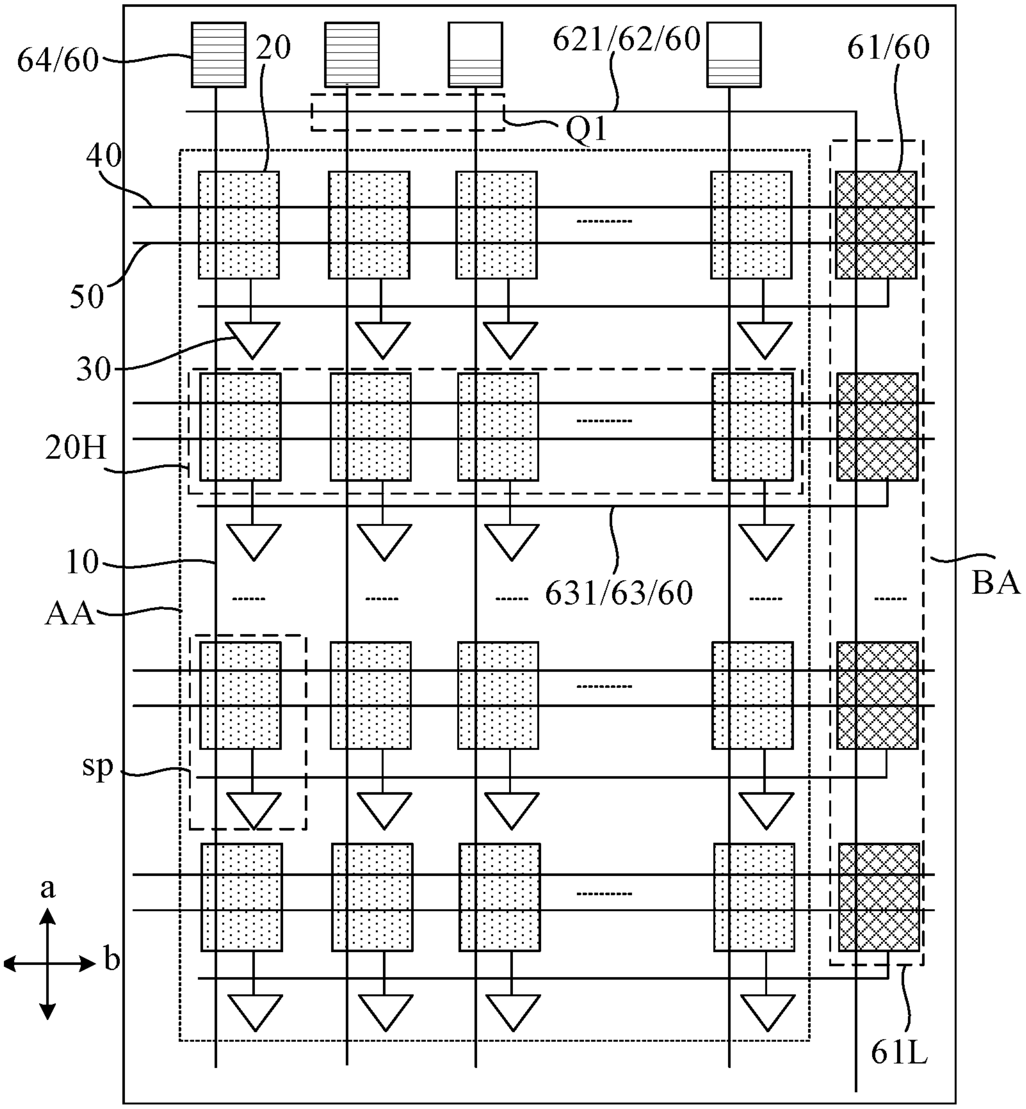
FIG. 2 is a schematic diagram of a display panel according to an embodiment of the present disclosure.
Figure 3:
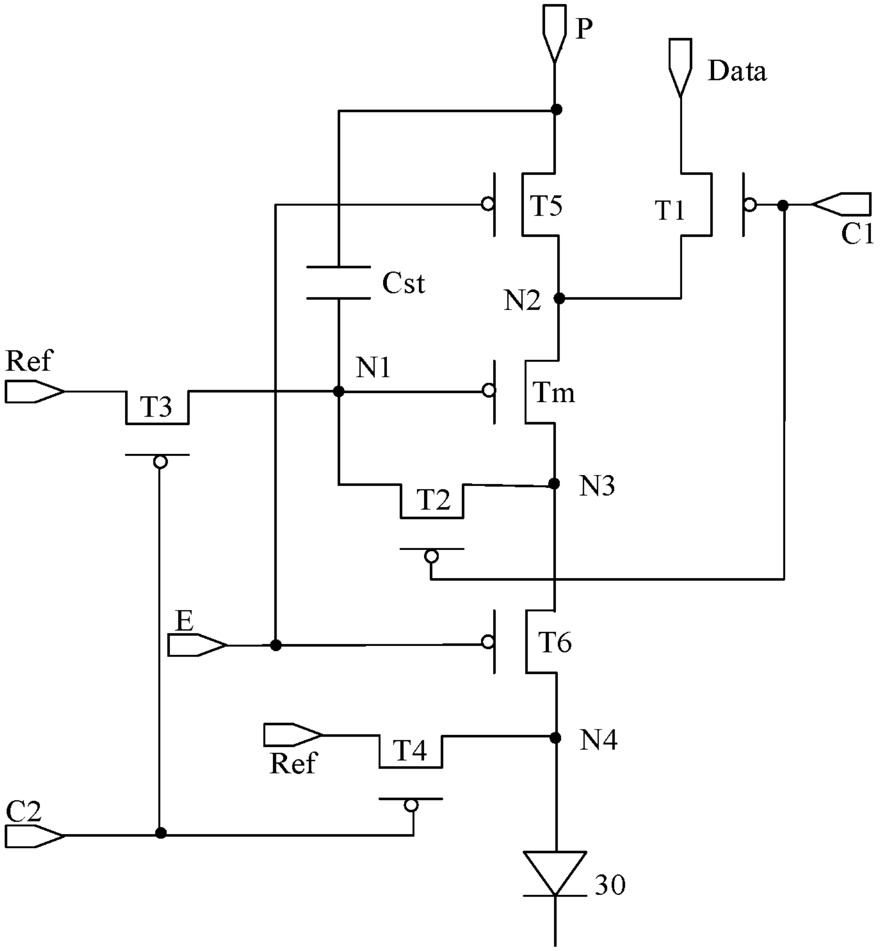
FIG. 3 is a schematic diagram of a pixel circuit of a display panel according to an embodiment of the present disclosure.

FIG. 2 is a schematic diagram of a display panel according to an embodiment of the present disclosure, and FIG. 3 is a schematic diagram of a pixel circuit in a display panel according to an embodiment of the present disclosure.

The display panel provided in an embodiment of the present disclosure includes a substrate, and pixels, and signal lines. The pixels and signal lines are located at a side of the substrate. FIG. 2 illustrates multiple pixels sp and multiple signal lines 10. The pixel sp includes a first pixel circuit 20 and a light-emitting device 30. The light-emitting device 30 includes a first electrode, a light-emitting layer, and a second electrode that are stacked. In some embodiments, the light-emitting device 30 is an organic light-emitting device. In other embodiments, the light-emitting device 30 is an inorganic light-emitting device.

As shown in FIG. 3, the pixel circuit includes seven transistors and a capacitor. In other words, the pixel circuit is a 7T1C pixel circuit. As shown in FIG. 3, the pixel circuit 10 includes a drive transistor Tm, a data writing transistor T1, a threshold compensation transistor T2, a gate reset transistor T3, an anode reset transistor T4, a first light-emitting control transistor T5, and a second light-emitting control transistor T6. FIG. 3 further illustrates a first scanning signal C1, a second scanning signal C2, a light-emitting control signal E, a power supply signal P, a reset signal Ref, a data signal Data, and a storage capacitor Cst. The gate reset transistor T3 and the anode reset transistor T4 can be controlled by a same signal line, or controlled by two gate signal lines, respectively, which is designed based on the actual need. FIG. 3 shows only one embodiment.

A gate of the gate reset transistor T3 receives the second scanning signal C2, a first electrode of the gate reset transistor T3 receives the reset signal Ref, and a second electrode of the gate reset transistor T3 is coupled to a node N1. A gate of the drive transistor Tm is coupled to the node N1, a first electrode of the drive transistor Tm is coupled to a node N2, and a second electrode of the drive transistor Tm is coupled to a node N3. A gate of the electrode reset transistor T4 receives the second scanning signal C2, a first electrode of the electrode reset transistor T4 receives the reset signal Ref, and a second electrode of the electrode reset transistor T4 is coupled to a node N4. A first electrode of the light-emitting device 30 is connected to the node N4. A gate of the data writing transistor T1 receives the first scanning signal C1, a first electrode receives the data signal Data, and a second electrode is coupled to a node N2. A gate of the threshold compensation transistor T2 receives the first scanning signal C1, a first electrode of the threshold compensation transistor T2 is coupled to a node N3, and a second electrode of the threshold compensation transistor T2 is coupled to the node N1. A gate of the first light-emitting control transistor T5 and a gate of the second light-emitting control transistor T6 both receive the light-emitting control signal E, a first electrode of the first light-emitting control transistor T5 receives the power supply signal P, and a second electrode of the first light-emitting control transistor T5 is coupled to the node N2. A first electrode of the second light-emitting control transistor T6 is coupled to the node N3, and a second electrode of the second light-emitting control transistor T6 is coupled to the node N4.

FIG. 3 shows only an embodiment of the pixel circuit structure, which is not intended to limit the embodiments of the present disclosure. The first pixel circuit 20 in the pixel sp can adopt the structure shown in FIG. 3.

As shown in FIG. 2, the signal line 10 in the display panel extends in a first direction 'a' and are coupled to multiple first pixel circuits 20. That is, multiple first pixel circuits 20 are coupled to a same signal line 10. It also indicates that one signal line 10 corresponds to multiple pixels sp.

Taking the signal lines 10 being data lines in FIG. 2 as an example, the display panel further includes scanning lines 40 and light-emitting control lines 50. The scanning line 40 extends in a second direction 'b,' and the scanning lines 40 are coupled to multiple first pixel circuits 20; and the light-emitting control line 50 extends in the second direction b, and the light-emitting control lines 50 are coupled to multiple first pixel circuits 20. The second direction b intersects the first direction a. With reference to the pixel circuit shown in FIG. 3, the scanning lines 40 include a scanning line configured to provide a first scanning signal C1 and a scanning line configured to provide a second scanning signal C2, and the light-emitting control line 50 is configured to provide a light-emitting control signal E. The display panel further includes a reset signal line and a power supply signal line, the reset signal line is configured to provide a reset signal to the pixel circuit, and the power supply signal line is configured to provide a power supply signal to the pixel circuit.

Multiple first pixel circuits 20 shown in FIG. 2 and coupled to a same signal line 10 are arranged in the first direction a, that is, one column of first pixel circuits 20 are correspondingly coupled to a same signal line 10. In some embodiments, two columns of first pixel circuits 20 are coupled to a same signal line 10.

As shown in FIG. 2, the display panel further includes pixel repair structures 60. The pixel repair structures 60 are configured to repair the defective pixel in the display panel, to ensure the defective pixels with display defects to display normally. The pixel repair structures 60 include a second pixel circuit 61, a first repair assembly 62, a second repair assembly 63, and a first compensation structure 64. The first compensation structures 64 are in a one-to-one correspondence with the signal lines 10, that is, one signal line 10 corresponds to one first compensation structure 64. The first compensation structure 64 is configured to compensate parasitic capacitance on the signal line 10. A structure of the first compensation structure 64 and the coupling or non-coupling between the first compensation structure 64 and the signal line 10 are described in the relevant embodiments below.

FIG. 2 is a simplified top view of the display panel, without showing other structures such as the substrate of the display panel. In an embodiment of the present disclosure, the first repair assembly 62 partially overlaps at least one signal line 10 in a direction perpendicular to a plane of the substrate. An implementation in which the first repair assembly 62 partially overlaps the signal line 10 is described in the relevant embodiments below. In some embodiments, the first repair assembly 62 includes a first repair line 621 partially overlapping a corresponding signal line 10. In other embodiments, the first repair assembly 62 further includes a first repair spacer partially overlapping a corresponding signal line 10. In other embodiments, the first repair assembly 62 further includes a first transistor, and the first transistor partially overlaps a corresponding signal line 10 in the direction perpendicular to the plane of the substrate. In the embodiment of FIG. 2, an example in which the first repair line 621 overlaps the signal line 10. When there is a defective pixel in the display panel, the first repair assembly 62 overlaps and is coupled to a corresponding signal line 10. When there is no defective pixel in the display panel, the first repair assembly 62 is not coupled to the signal line 10 overlapping the first repair assembly 62.

The second repair assembly 63 partially overlaps at least one light-emitting device 30 in the direction perpendicular to the plane of the substrate. In some embodiments, the second repair assembly 63 includes a second repair line 631 and a second repair spacer that partially overlaps a first electrode of the light-emitting device 30. FIG. 2 shows the light-emitting device 30 briefly, and does not show the second repair spacer of the second repair assembly 63. When there is a defective pixel in the display panel, the second repair assembly 63 overlaps and is coupled to the light-emitting device 30 of the defective pixel. When there is no defective pixel in the display panel, the second repair assembly 63 is not coupled to the light-emitting devices 30 overlapping the second repair assembly 63.

In the pixel repair structure 60, a first input terminal of the second pixel circuit 61 is coupled to the first repair assembly 61. For example, the first input terminal of the second pixel circuit 61 is coupled to the first repair line 621, and an output terminal of the second pixel circuit 61 is coupled to the second repair assembly 63. For example, the output terminal of the second pixel circuit 61 is coupled to at least one second repair line 631.

Taking the second pixel circuit 61 having the pixel circuit structure shown in FIG. 3 as an example, in a case where the signal line 10 is a data line, the first input terminal of the second pixel circuit 61 is a data signal input terminal, i.e., the first electrode of the data writing transistor T1. The output terminal of the second pixel circuit 61 is a port for outputting a drive current. The output terminal of the second pixel circuit 61 can be the second electrode of the second light-emitting control transistor T6. In an embodiment, the output terminal of the second pixel circuit 61 can be located at a position where the pixel circuit is connected to an anode of the light-emitting device 30.

In other embodiments, the signal line 10 is a scanning line. When the signal line 10 is the first scanning line configured to provide the first scanning signal C1, the first input terminal of the second pixel circuit 61 can be the gate of the data writing transistor T1. When the signal line 10 is the second scanning line configured to provide the second scanning signal C2, the first input terminal of the second pixel circuit 61 can be the gate of the gate reset transistor T3.

Multiple second pixel circuits 61 are shown in FIG. 2, and the second pixel circuit 61 is coupled to a corresponding scanning line 40 and a corresponding light-emitting control line 50, to ensure that the transistors of the second pixel circuits 61 can operate normally when the second pixel circuits 61 is used. As shown in FIG. 2, multiple first pixel circuits 20 are arranged in a pixel circuit row 20H in the second direction b, and one second pixel circuit 61 corresponds to one row of first pixel circuits 20. That is, the second pixel circuit 61 and the first pixel circuit 20 that are located in a same row are coupled to a same scanning line 40 and a same light-emitting control line 50, to achieve synchronized operation between the defective pixel and other pixels located in a same row as the defective pixel.

The display panel provided in the embodiment of the present disclosure includes the pixel repair structures 60, and the pixel repair structures 60 include the second pixel circuit 61, the first repair assembly 62, the second repair assembly 63, and the first compensation structure 64. When there is a defective pixel in the display panel, the first input terminal of the second pixel circuit 61 is coupled to a signal line 10 corresponding to the defective pixel through the first repair assembly 62. The output terminal of the second pixel circuit 61 is coupled to the light-emitting device 30 of the defective pixel through the second repair assembly 63, such that the second pixel circuit 61 can drive the light-emitting device 30 of the defective pixel to emit light and the pixel circuit of the defective pixel is replaced, thereby repairing the defective pixel. In the embodiment of the present disclosure, the first compensation structures 64 are in a one-to-one correspondence with the signal lines 10. When there is a defective pixel in the display panel, the signal line 10 corresponding to the defective pixel is disconnected to the first compensation structure 64 while other signal lines 10 in the display panel are coupled to the first compensation structures 64, respectively. Parasitic capacitance on the signal line 10 is pre-compensated by the first compensation structures 64. When a capacitance value compensated by the first compensation structure 64 is set to be basically the same as a parasitic capacitance value introduced by the pixel repair structure 60, the parasitic capacitance on the signal line 10 coupled to the first repair assembly 62 is basically the same as the parasitic capacitance on the signal line 10 coupled to the first compensation structure 64. In this way, loads on the signal lines of the display panel are basically the same, which prevents the brightness deviation caused by different signal delay between different signal lines 10 due to the large difference in load of different signal lines 10, and improves the display effect of the display panel after the defective pixel is repaired by the repair structure.

In an embodiment of the present disclosure, when the defective pixel in the display panel is repaired by the pixel repair structures 60, the first input terminal of the second pixel circuit 61 is coupled, through the first repair assembly 62, to the signal line 10 corresponding to the defective pixel, which is equivalent to extend the signal line 10 corresponding to the defective pixel. In this way, the signal line 10 passes through more pixel circuit structures, thereby increasing the parasitic capacitance on the signal line 10 corresponding to the defective pixel. After the parasitic capacitance on the signal line 10 correspondingly connected to the defective pixel is increased, the load on the signal line is increased, and the signal transmission between the signal line and a normal signal line 10 (a signal line that is not correspondingly connected to the defective pixel) differs greatly, resulting in an increase in the delay and deviation of signals that are transmitted by the signal line 10 and that are received by all pixels electrically connected to the signal line 10 corresponding to the defective pixel, which affects display brightness of these pixels, thus resulting in a poor display effect. The signal line 10 corresponding to the defective pixel is a repair signal line, and other signal lines 10 overlapping the first repair assembly 62 are non-repair signal lines. The increased parasitic capacitance on the repair signal line includes at least parasitic capacitance between the first repair assembly 62 and the non-repair signal lines overlapping the first repair assembly 62, and parasitic capacitance between the first repair line 621 coupled to the second pixel circuit 61 and multiple scanning lines or multiple light-emitting control lines of the display panel.

In some embodiments, the signal lines 10 can be data lines, the display panel includes multiple second pixel circuits 61, and multiple second pixel circuits 61 are arranged in a same direction as the extension direction of the data line. When the signal lines 10 are data lines and there is a defective pixel in the display panel that can be repaired by the pixel repair structures 60, the first repair assembly 62 is coupled to a data line overlapping the first repair assembly 62, the data line is not coupled to the first compensation structure 64, the second repair assembly 63 is coupled to the light-emitting device 30, and the second pixel circuit 61 is configured to drive the light-emitting device 30 to emit light. The data line is the data line corresponding to the defective pixel and transmits a data signal for the light-emitting device of the defective pixel to emit light. After the first repair assembly 62 is coupled to the data line, parasitic capacitance is generated on the data line, which includes at least parasitic capacitance between the first repair assembly 62 and data line overlapped with the first repair assembly 62 but not coupled to the first repair assembly 62, and parasitic capacitance between the first repair line 621 coupled to the second pixel circuit 61 and the scanning lines or light-emitting control lines. In an embodiment of the present disclosure, the data lines except the data line coupled to the first repair assembly 62 are correspondingly coupled to the first compensation structures 64, and the first compensation structures 64 are configured to compensate the capacitance. In this way, after the pixel repair structures 60 are used, the parasitic capacitance on data lines of the display panel is basically the same, and voltage drops of data lines are basically the same, thereby ensuring display uniformity.

Figure 4:
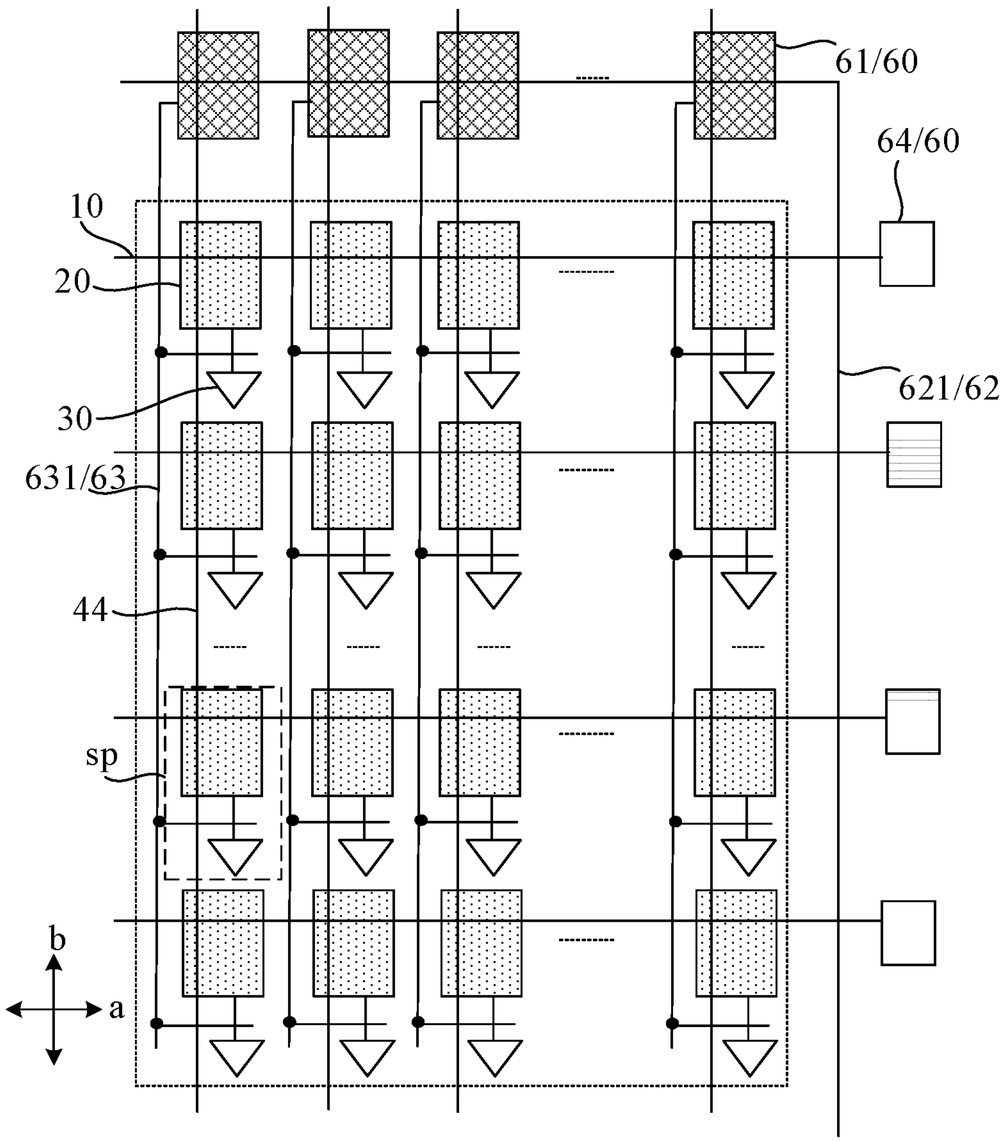
FIG. 4 is a schematic diagram of a display panel according to an embodiment of the present disclosure.

FIG. 4 is a schematic diagram of another display panel according to an embodiment of the present disclosure. In some embodiments, as shown in FIG. 4, the signal lines 10 can be scanning lines, and multiple second pixel circuits 61 of the display panel are arranged in a same direction as an extension direction of the scanning line. The signal line 10 extends along the first direction a. The display panel further includes data lines 44, and the data line 44 extends in the second direction b. The scanning lines are in a one-to-one correspondence with the first compensation structures 64, a first repair assembly 62 partially overlaps at least one scanning line, and a second repair assembly 63 partially overlaps at least one light-emitting device 30. A scanning signal input terminal of the second pixel circuit 61 (for example, the gate of the data writing transistor T1 or the gate of the gate reset transistor T3) is coupled to a first repair line 621, and an output terminal of the second pixel circuit 61 is coupled to a second repair line 631. FIG. 4 shows that a column of first pixel circuits 20 correspond to one second pixel circuit 61, and the second pixel circuit 61 can repair a pixel sp in which any of the first pixel circuits 20 in the corresponding row is located. When the signal lines 10 are scanning lines, the pixel repair structures 60 in the display panel are used, the first repair assembly 62 is coupled to a scanning line overlapping the first repair assembly 62, the scanning line is not coupled to the first compensation structure 64, the second repair assembly 63 is coupled to the light-emitting device 30, and the second pixel circuit 61 drives the light-emitting device 30 to emit light. After the first repair assembly 62 is coupled to the scanning line, parasitic capacitance is generated on the scanning line to increase the parasitic capacitance on the scanning line. In the embodiment of the present disclosure, the scanning lines except the scanning line coupled to the first repair assembly 62 are correspondingly coupled to the first compensation structures 64, and the first compensation structures 64 are configured to compensate the capacitance. In this way, when the pixel repair structures 60 are used, the parasitic capacitance on the scanning lines of the display panel is basically the same, and voltage drops of the scanning lines are basically the same, which ensures the first pixel circuits driven by the scanning lines 20 to operate in a basically same process, thereby ensuring display uniformity.

In the present disclosure, the second repair circuit 61 is directly connected to the signal line 10 corresponding to the defective pixel through the first repair assembly 62, and the second repair circuit 62 is connected to the light-emitting device 30 of the defective pixel through the second repair assembly 63, such that the second repair circuit 61 is directly connected to a pixel line in which the defective pixel is located. In this way, it can be ensured that pixels in a same line are turned on and lit at the same time, and thus the screen synchronization is better. There is no need to calculate data by a drive chip for the defective pixel, which reduces the power consumption of the drive chip and reduces the complexity. The first compensation structures 64 can be disposed in a non-display region located at two sides of the display panel in a same direction, to reduce the area of a single first compensation structure 64 and narrow the width of the bezel located at a single side, such that the adjustability is better.

In the embodiment of FIG. 2, the first compensation structures 64 are coupled to the signal lines 10 in a one-to-one correspondence, the first pixel circuit 20 is coupled to the light-emitting device 30 in the pixel sp, the first repair line 621 is not coupled to the signal lines 10 overlapping the first repair line 621, and the second repair line 631 is not coupled to the light-emitting devices 30 overlapping the second repair line 631. In other words, in the embodiment of FIG. 2, each first pixel circuit 20 works normally and can drive a corresponding light-emitting device 02 to emit light. In this case, there is no defective pixel in the display panel, and the pixel repair structures 60 are not used.

Figure 5:
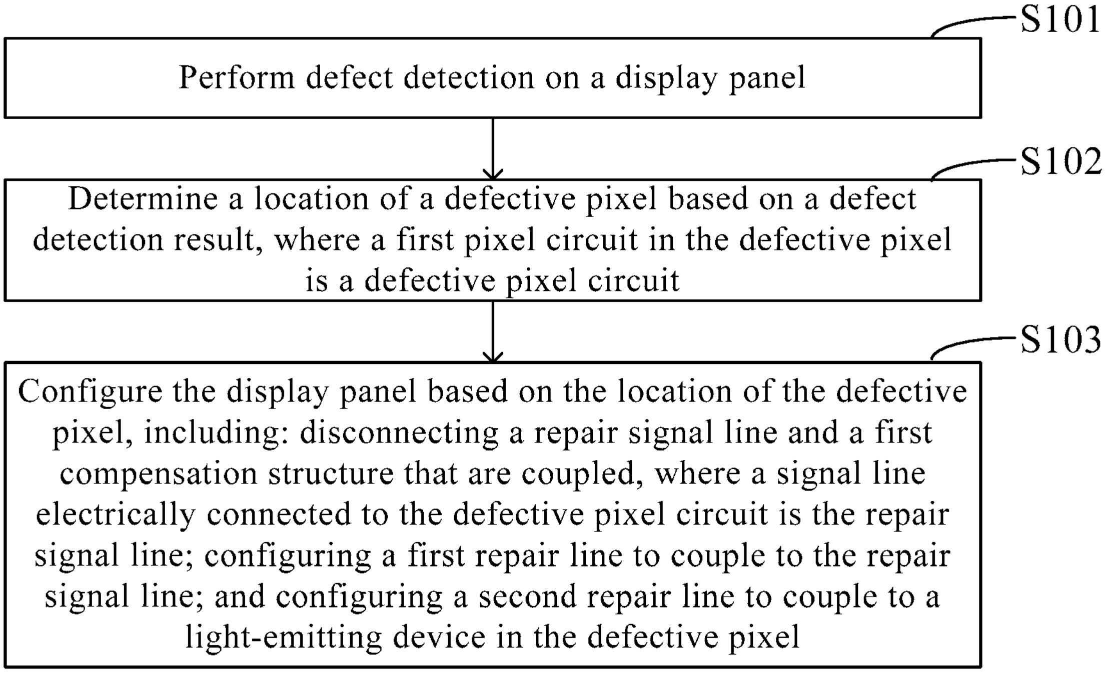
FIG. 5 is a flowchart of a method for repairing a display panel according to an embodiment of the present disclosure.

An embodiment of the present disclosure provides a method for repairing a display panel, which can be used to repair a defective pixel of the display panel. FIG. 5 is a flowchart of a method for repairing a display panel according to an embodiment of the present disclosure. As shown in FIG. 5, the method for repairing the display panel includes steps S101, S102, and S103.

At step S101, defect detection is performed on the display panel to determine whether there is a defective pixel in the display panel. For example, a lighting test is performed on the display panel. When a pixel at a certain location cannot be lit, it is determined that the pixel has a display defect.

At step S102, a location of the defective pixel is determined based on a defect detection result. A first pixel circuit 20 in the defective pixel is a defective pixel circuit. For example, a pixel with display defect in a certain row and a certain column can be determined through analysis based on the defect detection result. Each light-emitting device 30 in the pixel sp is coupled to the corresponding first pixel circuit 20 after the display panel is manufactured, such that the location of the defective pixel first pixel circuit 20 can also be determined based on the location of the defective pixel.

At step S103, the display panel is configured based on the location of the defective pixel. The configuring the display panel based on the location of the defective pixel includes: disconnecting a repair signal line and a first compensation structure 64 that are coupled, where a signal line 10 electrically connected to the defective pixel circuit is the repair signal line; coupling a first repair line 621 to the repair signal line; and coupling a second repair line 631 to a light-emitting device 30 of the defective pixel.

In some implementations, the first compensation structures 64 are coupled to the signal lines 10 in a one-to-one correspondence after the display panel is manufactured. When the display panel is configured according to step S103, the repair signal line and the first compensation structure 64 that are coupled to each other can be disconnect from each other using a laser fusion process. A laser fusion process is used to couple the first repair line 621 to the repair signal line overlapping the first repair line 621, and to couple the second repair line 631 to the light-emitting device 30 overlapping the second repair line 631, to achieve signal transmission between the repair circuit and the light-emitting device of the defective pixel.

The method for repairing the display panel provided in the embodiment of the present disclosure can repair the defective pixel in the display panel. When a capacitance value compensated by the first compensation structure 64 is set to be basically the same as a value of the parasitic capacitance value generated after the signal line 10 is coupled to the pixel repair structure 60, the parasitic capacitance on the repair signal line is substantially the same as the parasitic capacitance on each normal signal line (that is, each non-repair signal line). In this way, the delay on the signal lines of the display panel is basically the same and the display effect of the repaired display panel is improved.

Figure 6:
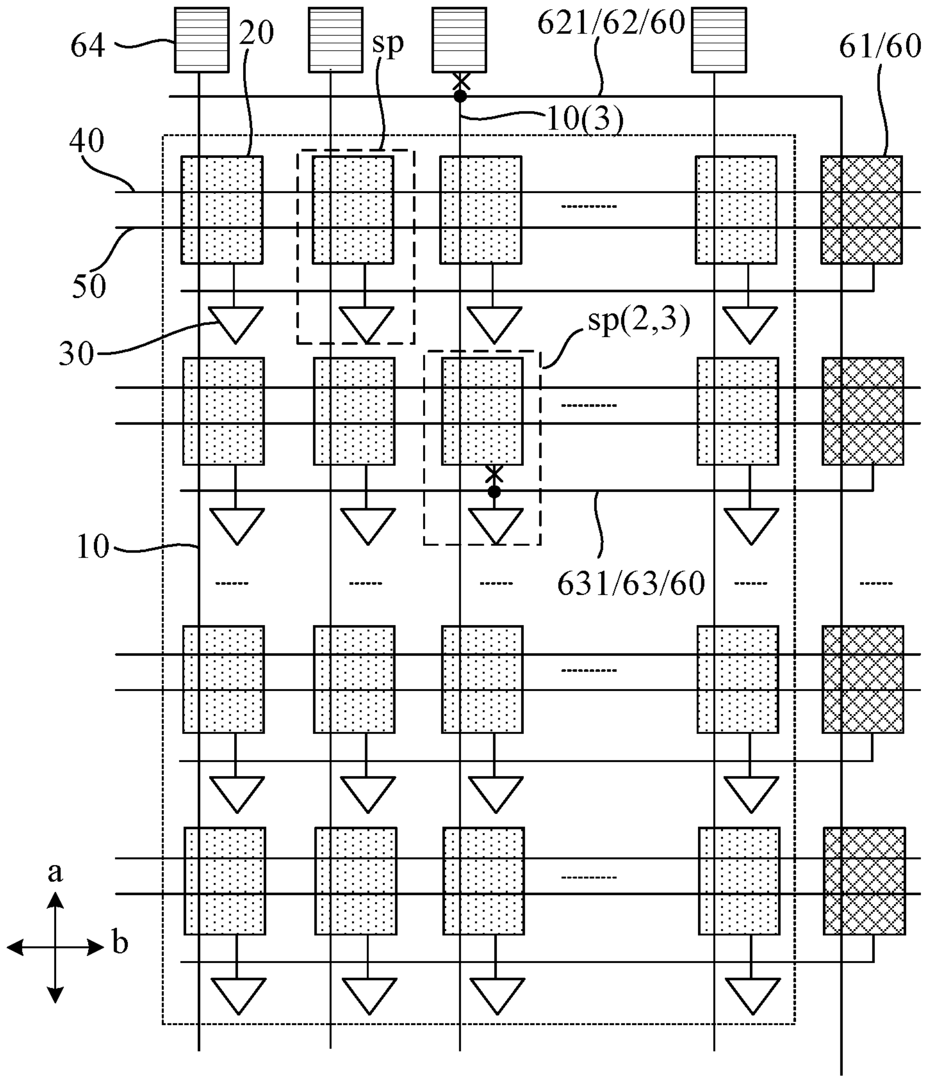
FIG. 6 is a schematic diagram of a display panel according to an embodiment of the present disclosure.

FIG. 6 is a schematic diagram of another display panel according to an embodiment of the present disclosure. The method for repairing the display panel provided in the embodiment of the present disclosure can be understood with reference to the structure shown in the embodiment of FIG. 6.

As shown in FIG. 6, there is a defective pixel in the display panel, i.e., a pixel sp (2, 3) located in the third column of the second row. A first pixel circuit 20 in the pixel sp (2, 3) in the second row and third column is coupled to a signal line 10(3). The signal line 10(3) corresponding to the defective pixel sp (2, 3) is a repair signal line, other signal lines 10 except the signal line 10(3) in the display panel are non-repair signal lines. The signal line 10(3) is not coupled to a corresponding first compensation structure 64, and other signal lines 10 except the signal line 10(3) are coupled to corresponding first compensation structures 64, respectively. That is, the repair signal line is not coupled to the corresponding first compensation structure 64, and the non-repair signal lines are coupled to the corresponding first compensation structures 64. A first repair line 621 is coupled to the signal line 10(3), a second repair line 631 is coupled to a light-emitting device 30 of the pixel sp (2, 3). That is, the first repair line 621 is coupled to the repair signal line, and the second repair line 631 is coupled to the light-emitting device 30. A first pixel circuit 20 in the pixel sp to which the light-emitting device 30 coupled to the second repair line 631 belongs is coupled to the repair signal line.

The first pixel circuit 20 in the pixel sp (2, 3) in the embodiment of FIG. 6 cannot drive the light-emitting device 30 to emit light, and the pixel sp (2, 3) can be repaired by the pixel repair structures 60. The signal line 10(3) is configured to be not coupled to the corresponding first compensation structure 64, that is, the two are disconnected, in other words, being insulated from each other. The first repair assembly 62 is configured to couple to the signal line 10(3), and a first input terminal of the second pixel circuit 61 is coupled to the signal line 10(3) through the first repair line 621. In this case, a signal of the signal line 10(3) can be transmitted to the first repair line 621. The second repair assembly 63 is coupled to the light-emitting device 30 in the pixel sp (2, 3), and an output terminal of the second pixel circuit 61 is coupled to the light-emitting device 30 in the pixel sp (2, 3) through the second repair line 631. For example, the signal line 10(3) is a data line. When the display panel is driven to display images, a data signal is provided to the second pixel circuit 61 through the first repair assembly 62 from the signal line 10(3), to drive the second pixel circuit 61 to operate. A drive current generated by the second pixel circuit 61 is provided to the light-emitting device 30 of the pixel sp (2, 3) through the second repair assembly 63, to light the light-emitting device 30, thereby repairing the pixel sp (2, 3). This implementation enables the pixel repair structures 60 to repair the defective pixel sp. In this embodiment, the signal line 10(3) coupled to the defective pixel can be understood as the repair signal line, and other signal lines 10 can be understood as non-repair signal lines.

In the embodiment of FIG. 6, the repair signal line is configured to be not coupled to the corresponding first compensation structure 64, while the non-repair signal lines are configured to be coupled to the corresponding first compensation structures 64, to prevent the first compensation structure 64 from affecting load of the repair signal line. The first input terminal of the second pixel circuit 61 is coupled to the repair signal line through the first repair assembly 62, and the output terminal of the second pixel circuit 61 is coupled to the light-emitting device 30 in the defective pixel sp through the second repair assembly 63. In this way, the second pixel circuit 61 is configured to drive the light-emitting device 30 of the defective pixel to emit light, such that the defective pixel sp is repaired by the pixel repair structures 60. After the repair signal line is configured to couple to the first repair assembly 62, parasitic capacitance on the repair signal line is increased. The repair signal line is configured to be not coupled to the corresponding first compensation structure 64, and the non-repair signal lines are configured to couple to the corresponding first compensation structures 64. When the capacitance compensated by first compensation structure 64 is basically the same as the capacitance added to the repair signal line coupled to the first repair assembly 62, after the defective pixel is repaired, load of each non-repair signal line coupled to the first compensation structure 64 approximates load of the repair signal line not connected to the first compensation structure 64, and parasitic capacitance on the signal lines 10 in the display panel is basically the same, such that the delay on the signal lines is basically the same, ensuring display uniformity of the repaired display panel.

Figure 7:
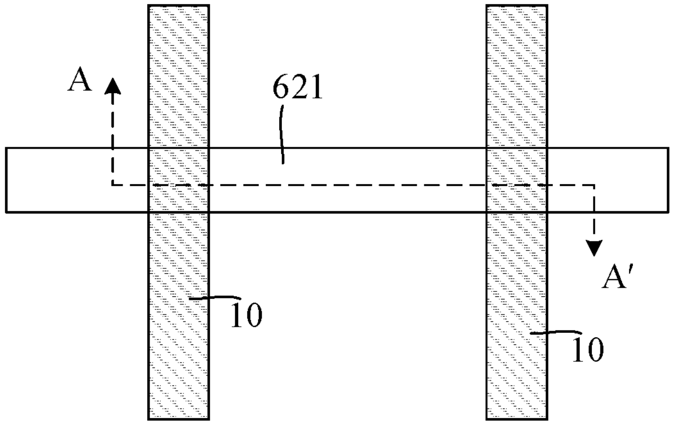
FIG. 7 is an enlarged schematic view of a region Q1 shown in FIG. 2.
Figure 8:
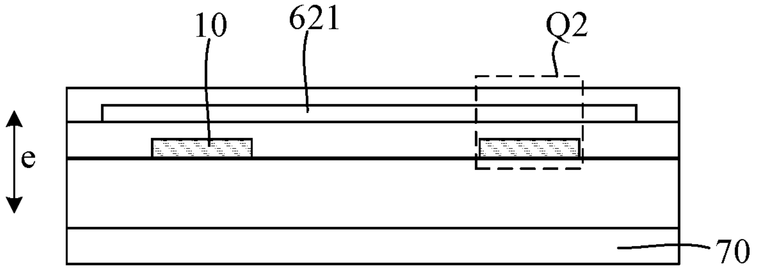
FIG. 8 is a cross-sectional view along line A-A' shown in FIG. 7.

In some embodiments, the first repair assembly 62 can be located in a different layer from the signal lines 10. FIG. 7 is an enlarged view of a region Q1 in FIG. 2, and FIG. 8 is a cross-sectional view along line A-A' shown in FIG. 7. With reference to FIG. 7 and FIG. 8, the first repair line 621 and the signal line 10 are located in different layers; and the first repair line 621 partially overlaps at least one signal line 10 in the direction e perpendicular to the plane of the substrate 70. FIG. 8 shows an overlap position Q2 between the first repair line 621 and the signal line 10 overlapped with it. For example, in FIG. 8, the first repair line 621 is located at a side of the signal line 10 facing away from the substrate 70. In other embodiments, the first repair line 621 is located at a side of the signal line 10 facing towards the substrate 70.

After the display panel is manufactured, the first repair line 621 is not coupled to the signal lines 10 overlapping the first repair line 621. After defect detection is performed on the display panel, if there is no defective pixel in the display panel, the display panel is not repaired. In some embodiments, the first repair line 621 is not coupled to the signal lines 10 overlapping the first repair line 621.

In other embodiments, the first repair line 621 is coupled to a signal line 10. If the location of the defective pixel is determined after the defect detection on the display panel, when coupling the first repair line 621 to the repair signal line, the location Q2 at which the first repair line 621 overlaps the signal line 10 can be heated using a laser fusion process, to couple the first repair line 621 to the signal line 10, thereby achieving signal transmission between the first repair line 621 and the signal line 10.

The first repair line 621 and the signal line 10 are disposed in different layers. In this way, when the extension direction of the first repair line 621 intersects the extension direction of the signal line 10, it is easier to wire the first repair line 621 and dispose the first repair line 621 to overlap multiple signal lines 10. When the display panel is configured based on the defect detection result, heating the location at which the first repair line 621 overlaps the signal line 10 can couple the first repair line 621 to the repair signal line, with fewer laser fusion sites and a simple process.

Figure 9:
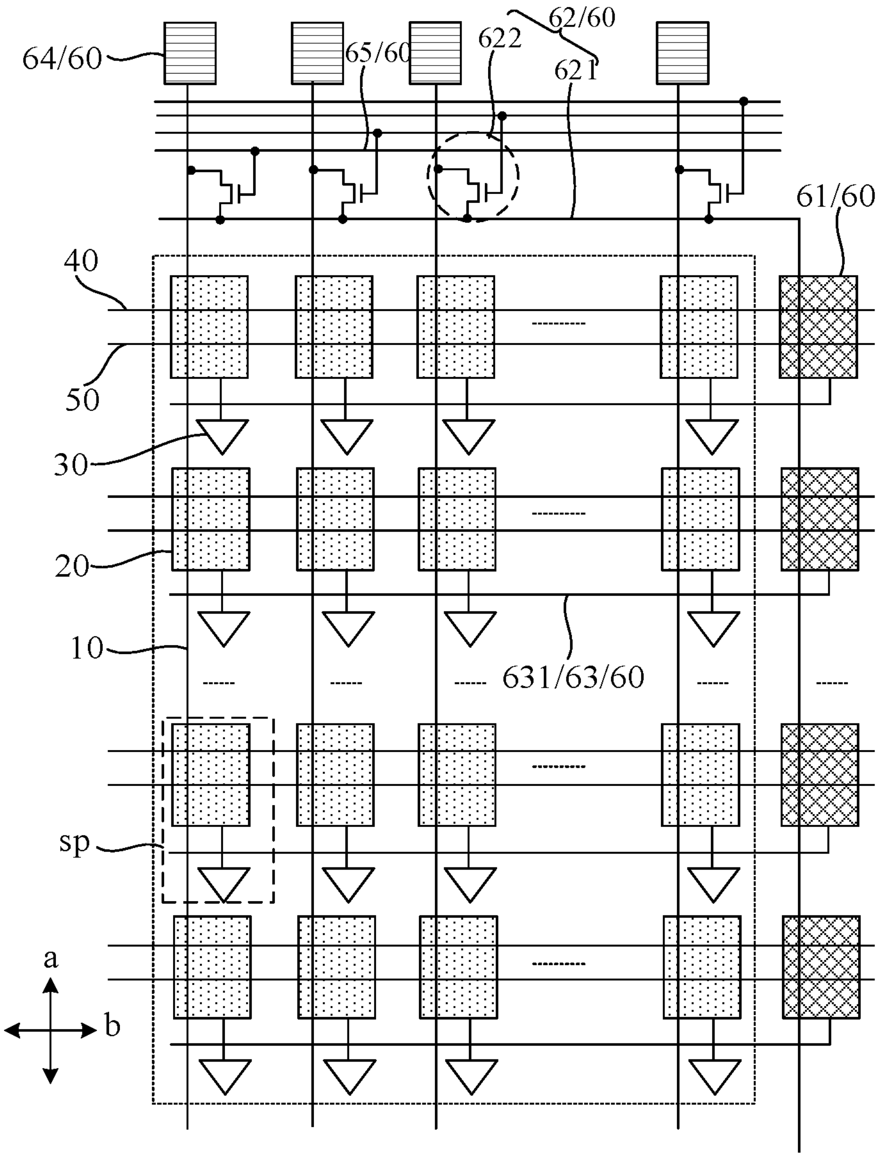
FIG. 9 is a schematic diagram of a display panel according to an embodiment of the present disclosure.

FIG. 9 is a schematic diagram of a display panel according to an embodiment of the present disclosure. In some embodiments, as shown in FIG. 9, a first repair assembly 62 further includes a first transistor 622, and a first repair line 621 is coupled to signal lines 10 through the first transistors 622. That is, a first electrode of the first transistor 622 is connected to the first repair line 621, and a second electrode of the first transistor 622 is connected to the signal line 10. The pixel repair structures 60 further include a control line 65, one control line 65 is correspondingly disposed for each first transistor 622, and a control electrode of the first transistor 622 is coupled to the control line 65. The operating state of the first transistor 622 is controlled by the control line 65. For example, the first transistor 622 in FIG. 9 is an n-type transistor. In some embodiments, the first transistor 622 is a p-type transistor. It is to be noted that in an embodiment, the second electrode of the first transistor 622 is typically coupled to the signal line 10 through a via. That is, at the via, the first transistor 622 at least partially overlaps the signal line 10 in a direction e perpendicular to a plane of the substrate 70. The shape of the signal line 10 is not limited in this application.

After defect detection is performed on the display panel, if it is determined that there is no defective pixel in the display panel, signals transmitted on the control lines 65 is configured based on the defect detection results, such that the control lines 65 control the first transistors 622 in cut-off state.

After defect detection is performed on the display panel, configuring the display panel based on the location of the defective pixel includes configuring the signal transmitted on the control line 65 based on the location of the defective pixel. A first transistor 622 coupled to a repair signal line is controlled to be turned on, and other first transistors 622 are all controlled to be cut off, such that the repair signal line is electrically connected to the first repair line 621.

Figure 10:
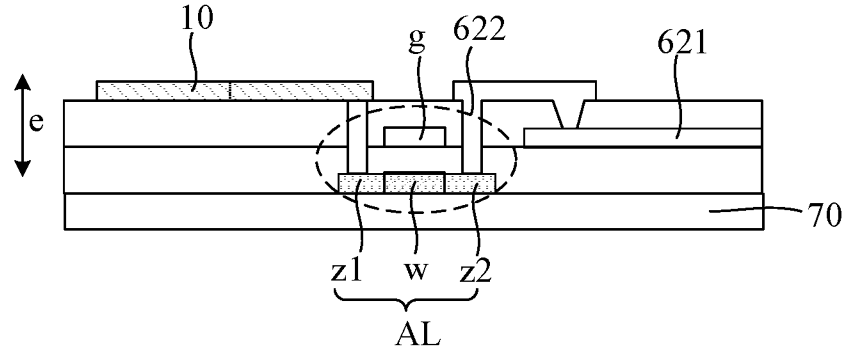
FIG. 10 is a schematic diagram of another display panel according to an embodiment of the present disclosure.

FIG. 10 is a schematic diagram of a display panel according to an embodiment of the present disclosure. FIG. 10 shows a manner of overlapping between a first repair assembly 62 and a signal line 10. As shown in FIG. 10, the first repair assembly 62 includes a first transistor 622, and the first transistor 622 includes a gate g and an active layer AL. The active layer AL includes a channel w, a first contact area z1, and a second contact area z2, and channel w overlaps the gate g in the direction perpendicular to the plane of the substrate 70. The first contact area z1 and the second contact area z2 are located at two sides of the channel w. One of the first contact area z1 and the second contact area z2 is a source contact area, and the other one of the first contact area z1 and the second contact area z2 is a drain contact area. The signal line 10 is connected to the first contact area z1 through a via located in an insulating layer, and it can be regarded that the signal line 10 overlaps the first contact area z1 in the direction e perpendicular to the plane of the substrate 70, that is, the signal line 10 partially overlaps the first transistor 622.

Figure 11:
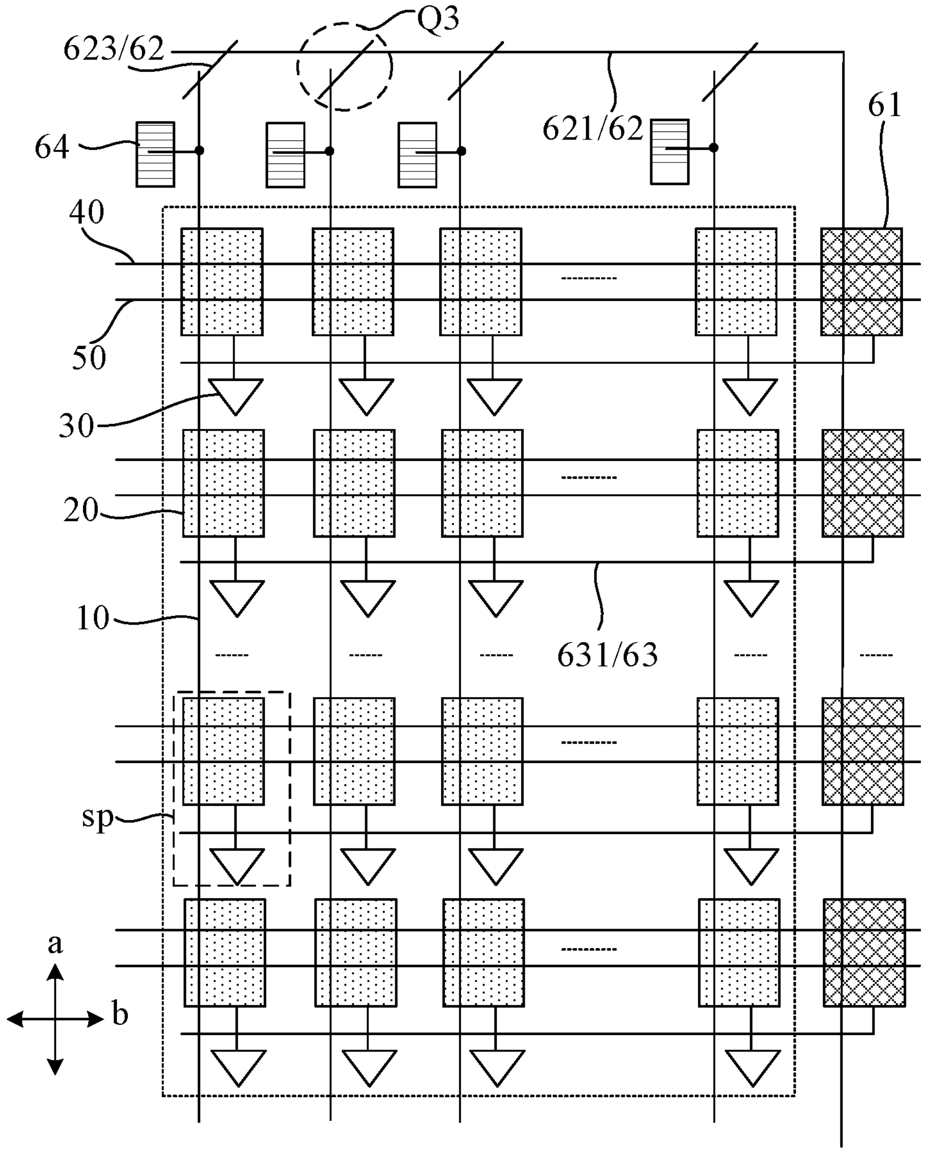
FIG. 11 is a schematic diagram of a display panel according to an embodiment of the present disclosure.
Figure 12:
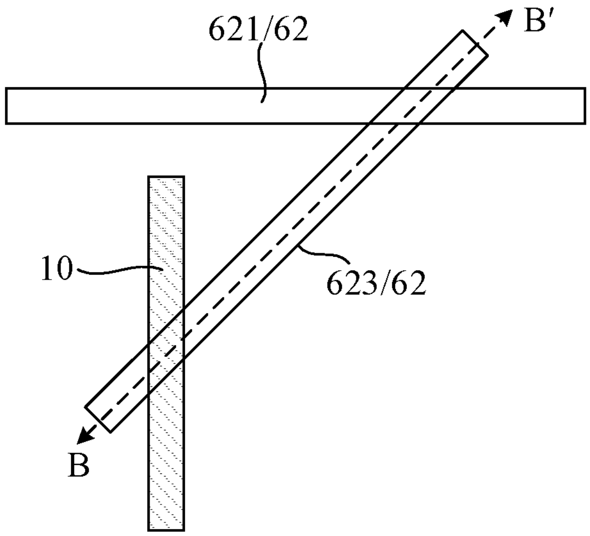
FIG. 12 is a partial schematic cross-sectional view of a display panel according to an embodiment of the present disclosure.
Figure 13:
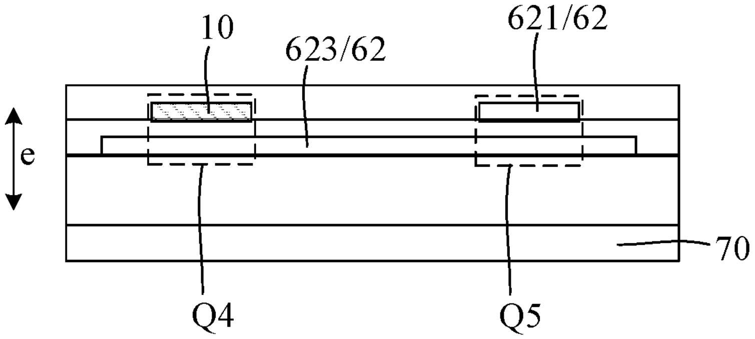
FIG. 13 is a cross-sectional view along line B-B' shown in FIG. 12.

In other embodiments, the first repair line 621 and the signal line 10 are located in a same layer. FIG. 11 is a schematic diagram of a display panel according to an embodiment of the present disclosure, and FIG. 12 is a partial cross-sectional view of a display panel according to an embodiment of the present disclosure. FIG. 13 is a cross-sectional view along line B-B' shown in FIG. 12. As shown in FIG. 11, the first repair assembly 62 further includes a first repair spacer 623. With reference to FIG. 12 and FIG. 13, in a direction e perpendicular to the plane of the substrate 70, one end of the first repair spacer 623 overlaps the first repair line 621, and another end of the first repair spacer 623 overlaps a signal line 10. The first repair spacer 623 and the first repair line 621 are located in different layers, and the first repair line 621 and the signal line 10 are located in a same layer. FIG. 13 schematically shows that the first repair spacer 623 is located at a side of the first repair line 621 and the signal line 10 facing towards the substrate 70. In some embodiments, the first repair spacer 623 is located at a side of the first repair line 621 facing away from the substrate 70 and located at a side of the signal line 10 facing away from the substrate 70. In some embodiment, a first compensation structure 64 and the first repair line 621 can be located at a same side of a pixel sp, or the first compensation structure 64 and the first repair line 621 can be located at different sides of the pixel.

In some embodiments, the first repair line 621 is not coupled to the signal line 10 overlapping the first repair line 621. After the display panel is manufactured, one end of the first repair spacer 623 overlaps the first repair line 621, and another end of the first repair spacer 623 overlaps the signal line 10. After defect detection is performed on the display panel, if it is determined that there is no defective pixel in the display panel, the display panel is not repaired, the first repair spacer 623 is not coupled to the first repair line 621, and the first repair spacer 623 is not coupled to the signal line 10, to ensure that the first repair line 621 is not coupled to the signal line 10 overlapping the first repair line 621.

In some embodiments, the first repair line 621 is coupled to one signal line 10. When the location of the defective pixel is determined after performing defect detection on the display panel, one end of the first repair spacer 623 is configured to be coupled to the first repair line 621, and another end of the first repair spacer 623 is configured to be coupled to the signal line 10. A laser fusion process can be used to heat a location Q4 where the first repair spacer 623 overlaps the first repair line 621 and a location Q5 where the first repair spacer 623 overlaps the signal line 10, to couple the first repair line 621 to the signal line 10.

Figure 14:
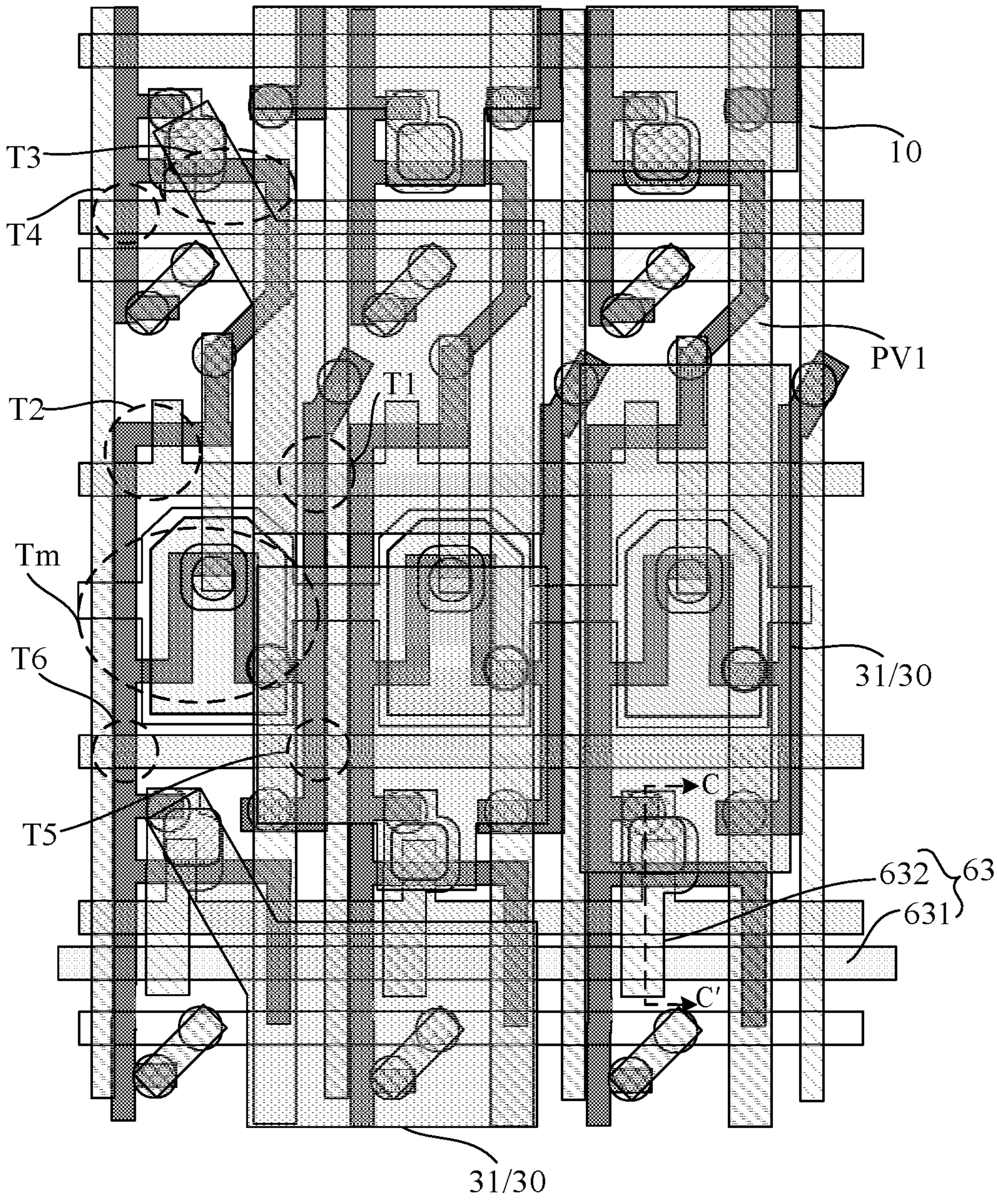
FIG. 14 is a partial schematic view of a display panel according to an embodiment of the present disclosure.
Figure 15:
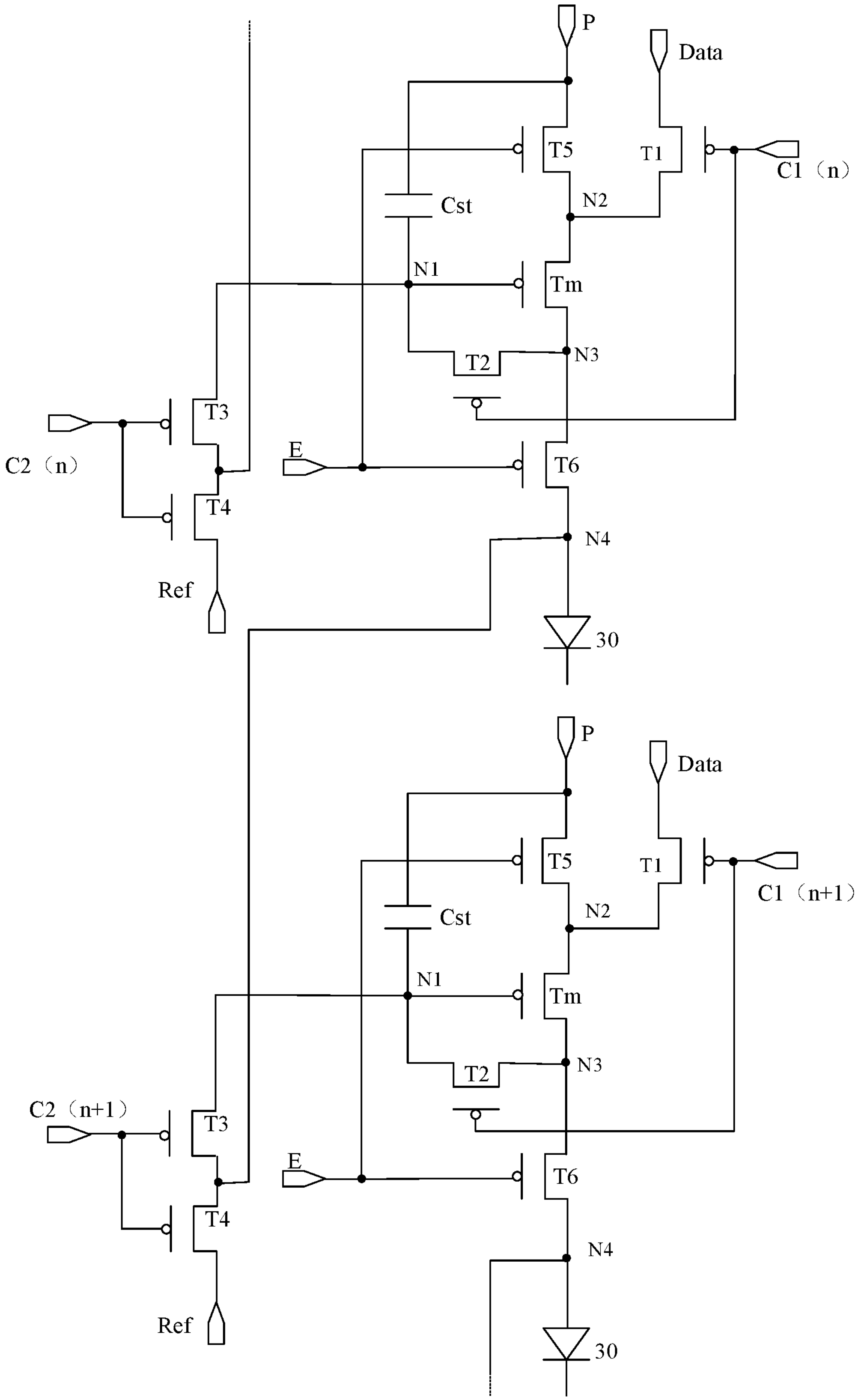
FIG. 15 is a schematic diagram of pixel circuits in the embodiment of FIG. 14.
Figure 16:
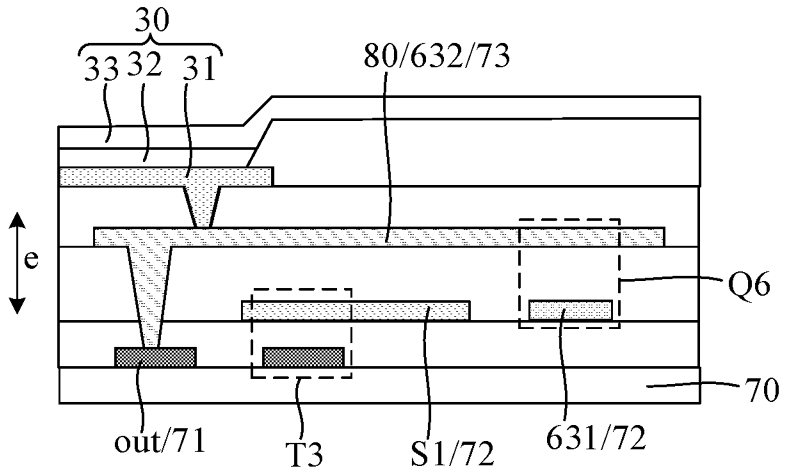
FIG. 16 is a cross-sectional view along line C-C' shown in FIG. 14.

FIG. 14 is a partial view of a display panel according to an embodiment of the present disclosure, and FIG. 15 is a schematic diagram of pixel circuits in the embodiment of FIG. 14. FIG. 16 is a cross-sectional view along line C-C' shown in FIG. 14. FIG. 14 schematically shows transistors of the first pixel circuit 20 and a first electrode 31 of the light-emitting device 30. The transistors of the first pixel circuit 20 can be referred to FIG. 15.

As shown in FIG. 15, a gate of a gate reset transistor T3 and a gate of an electrode reset transistor T4 are coupled to a second scanning signal C2, a gate of a data writing transistor T1 and a gate of a threshold compensation transistor T2 are coupled to a first scanning signal C1, and a gate of a first light-emitting control transistor T5 and a gate of a second light-emitting control transistor T6 are coupled to a light-emitting control signal E. FIG. 15 schematically shows a pixel circuit in an $n^{th}$ row and a pixel circuit in an $(n+1)^{th}$ row, where n is a positive integer. Taking the pixel circuit in the $(n+1)^{th}$ row as an example, in the pixel circuit in the $(n+1)^{th}$ row, the gate of the gate reset transistor T3 and the gate of the electrode reset transistor T4 are coupled to a same control terminal, a first electrode of the electrode reset transistor T4 is coupled to a reset signal Ref, a first electrode of the gate reset transistor T3 is coupled to a second electrode of the electrode reset transistor T4, and a second electrode of the gate reset transistor T3 is coupled to a node N1. A second electrode of the electrode reset transistor T4 of the pixel circuit in the $(n+1)^{th}$ row is coupled to a node N4 of the pixel circuit in the $n^{th}$ row. When the gate reset transistor T3 and the electrode reset transistor T4 in the pixel circuit in the $(n+1)^{th}$ row are turned on, the reset signal Ref is provided to the node N1 to reset a gate of a drive transistor Tm. When the electrode reset transistor T4 is turned on, the reset signal Ref is further provided to the node N4 of the pixel circuit in the $n^{th}$ row to reset the node N4. The display panel includes cascaded shift registers configured to provide scanning signals to the pixel circuits. An input terminal of an $n^{th}$-stage shift register is connected to an output terminal of an $(n-1)^{th}$-stage shift register, and an output terminal of the $n^{th}$-stage shift register is connected to an input terminal of the an $(n+1)^{th}$-stage shift register. For the pixel circuit in the $n^{th}$ row, the output terminal of the $(n-1)^{th}$-stage shift register provides a second scanning signal C2($n$) to the pixel circuit in the $n^{th}$ row, and the output terminal of the $n^{th}$-stage shift register provides a first scanning signal C1($n$) to the pixel circuit in the $n^{th}$ row. For the pixel circuit in the $(n+1)^{th}$ row, the output terminal of the $n^{th}$-stage shift register provides a second scanning signal C2 (n+1) to the pixel circuit in the $(n+1)^{th}$ row, and the output terminal of the $(n+1)^{th}$-stage shift register provides a first scanning signal C1 (n+1) to the pixel circuit in the $(n+1)^{th}$ row. That is, the first scanning signal C1 ($n$) received by the pixel circuit in the $n^{th}$ row and the second scanning signal C2 (n+1) received by the pixel circuit in the $(n+1)^{th}$ row are the same signal. Similarly, the second scanning signal C2 ($n$) received by the pixel circuit in the $n^{th}$ row and the first scanning signal C1 (n−1) received by the pixel circuit in the $(n-1)^{th}$ row are a same signal.

It can be understood that the pixel circuit structures shown in FIG. 3 and FIG. 15 are only examples and are not intended to limit the present disclosure. The first pixel circuit 20 and the second pixel circuit 61 in the embodiments of the present disclosure can be any pixel circuit in the related art.

In an embodiment of the present disclosure, the second repair assembly 63 includes a second repair line 631 and a second repair spacer 632. With reference to FIG. 16, the light-emitting device 30 further includes a first electrode 31, a light-emitting layer 32, and a second electrode 33 that are stacked, and the second electrode 33 is located at a side of the first electrode 31 facing away from the substrate 70. The second repair spacer 632 and the second repair line 631 are located in different layers. In the direction e perpendicular to the plane of the substrate 70, one end of the second repair spacer 632 overlaps the first electrode 31, and another end of the second repair spacer 632 overlaps the second repair line 631.

As shown in FIG. 16, the first electrode 31 and the output terminal out of the first pixel circuit are located in different layers, and the first electrode 31 is connected to the output terminal out of the first pixel circuit through a connection electrode 80. In some embodiments, the connection electrode 80 is also used as the second repair spacer 632. Only an opening shape of a mask plate used to manufacture the connection electrode 80 can be designed during manufacturing, and no new process is added.

In some embodiments, the second repair line 631 is not coupled to the light-emitting device 30. After the display panel is manufactured, one end of the second repair spacer 632 overlaps and is coupled to the first electrode 31 through a via located in the insulating layer, and another end of the second repair spacer 632 overlaps the second repair line 631. After defect detection is performed on the display panel, if it is determined that there is no defective pixel in the display panel, the display panel is not repaired, and another end of the second repair spacer 632 overlaps but is not coupled to the second repair line 631, to ensure that the second repair line 631 is not coupled to the light-emitting device 30.

In other embodiments, the second repair line 631 is coupled to the light-emitting device 30. If the location of the defective pixel is determined after the defect detection is performed on the display panel, a location Q at which the second repair spacer 632 overlaps the second repair line 631 is heated with a laser fusion process, to couple the second repair spacer 632 to the second repair line 631, such that the second repair line 631 is coupled to the light-emitting device 30.

FIG. 16 further shows a semiconductor layer 71, a first metal layer 71, and a second metal layer 73 that are located at a side of the substrate 70. The output terminal out of the first pixel circuit is located in the semiconductor layer 71, and active layers of the transistors of the first pixel circuit are located in the semiconductor layer 71. FIG. 16 further shows a scanning line S1, and the gate of the gate reset transistor T3 is coupled to the scanning line S1. The scanning line S1 is located in the first metal layer 71. The connection electrode 80 is located in the second metal layer 73, and the second repair line 631 is located in the first metal layer 71. The display panel further includes a third metal layer, and the third metal layer is located between the first metal layer 71 and the second metal layer 73. One electrode plate of a storage capacitor Cst is located in the first metal layer 72, and another electrode plate is located in the third metal layer.

Figure 17:
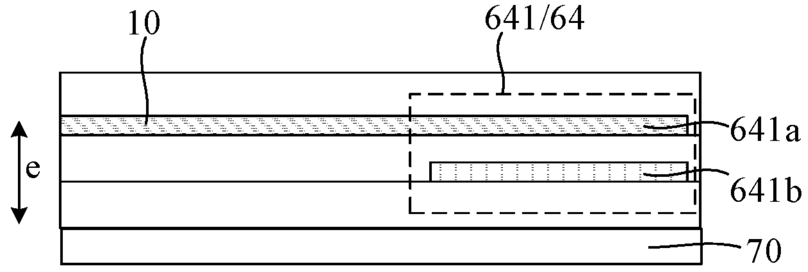
FIG. 17 is a partial cross-sectional view of a display panel according to an embodiment of the present disclosure.

FIG. 17 is a partial cross-sectional view of a display panel according to an embodiment of the present disclosure. In some embodiments, as shown in FIG. 17, a signal line 10 corresponds to a first compensation structure 64. The first compensation structure 64 includes a first compensation capacitor 641, the first compensation capacitor 641 includes a first electrode plate 641*a* and a second electrode plate 641*b* that overlap in a direction perpendicular to the plane of the substrate 70. The first electrode plate 641*a* and the signal line 10 are located in a same layer and are coupled to each other. For example, in FIG. 17, the second electrode plate 641*b* is located at a side of the first electrode plate 641*a* facing towards the substrate 70. In some implementations, the second electrode plate 641*b* is located at a side of the first electrode plate 641*a* facing away from the substrate 70. Only an opening shape of a mask plate used to manufacture the signal line 10 can be designed during manufacturing, that is, the signal line 10 and the first electrode plate 641*a* of the first compensation capacitor 641 can be manufactured in one process. At the same time, the second electrode plate 641*b* can be manufactured with the original layer of the display panel without additional process. In an embodiment, an overlap area between the second electrode plate 641*b* and the first electrode plate 641*a* is designed based on a value of the capacitance to be compensated by the first compensation capacitor 641.

In some implementations, the first electrode plate 641*a* of the first compensation capacitor 641 is coupled to the signal line 10, the second electrode plate 641*b* is coupled to a first constant-voltage signal line configured to transmit a constant-voltage signal. As shown in FIG. 14, the display panel includes a first power supply signal line PV1 configured to provide a first power supply signal, and the first power supply signal is a constant-voltage signal. A first electrode of a first light-emitting control transistor T5 and one electrode plate of the storage capacitor Cst are coupled to the first power supply signal line PV1. In some embodiments, the constant-voltage signal line includes the first power supply signal line PV1.

Figure 18:
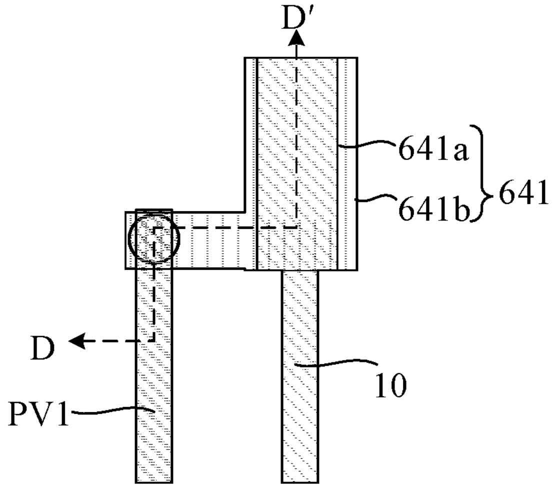
FIG. 18 is a partial view of a display panel according to an embodiment of the present disclosure.

Taking the signal line 10 being a data line as an example, a first electrode of the data writing transistor T1 is coupled to the signal line 10. FIG. 14 shows the signal line 10. In some embodiments, the first power supply signal line PV1 and the signal line 10 are located in a same layer. FIG. 18 is a partial view of a display panel according to an embodiment of the present disclosure, and FIG. 19 is a cross-sectional view along line D-D' shown in FIG. 18.

Figure 19:
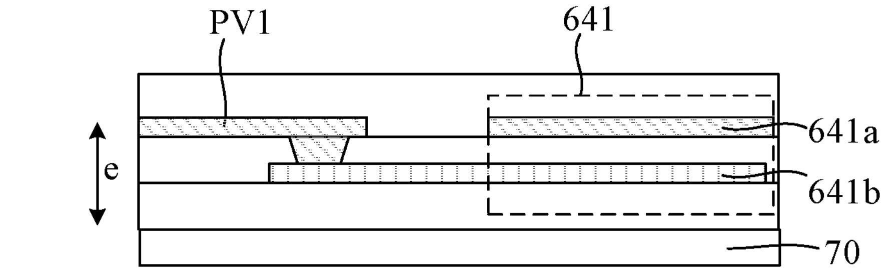
FIG. 19 is a cross-sectional view along line D-D' shown in FIG. 18.

With reference to FIG. 18 and FIG. 19, the first electrode plate 641*a* and the second electrode plate 641*b* of the first compensation capacitor 641 overlap, the first electrode plate 641*a* of the first compensation capacitor 641 is coupled to the signal line 10, and the second electrode plate 641*b* of the first compensation capacitor 641 is coupled to the first power supply signal line PV1. In this way, voltage potentials are separately supplied to the first electrode plate 641*a* and the second electrode plate 641*b* of the first compensation capacitor 641, such that the first compensation capacitor 641 has a capacitance value to compensate capacitance of the signal line 10.

In some embodiments, after defect detection, if it is determined that there is no defective pixel in the display panel, the first electrode plate 641*a* of the first compensation capacitor 641 is configured to be coupled to the signal line 10, the second electrode plate 641*b* is configured to be coupled to the first power supply signal line PV1, and pixel repair structures 60 in the display panel are not used. In this case, parasitic capacitance on the signal lines 10 in the display panel is basically the same.

The display panel further includes a second power supply signal line, a second electrode 33 of the light-emitting device 30 is coupled to a second power supply signal line, and the second power supply signal line provides a constant-voltage signal. In some embodiments, the first constant-voltage signal line includes a second power supply signal line, the first electrode plate 641*a* of the first compensation capacitor 641 is coupled to the signal line 10, and the second electrode plate 641*b* is coupled to the second power supply signal line.

In other embodiments, after defect detection, if there is a defective pixel in the display panel, the first compensation capacitor 641 corresponding to the repair signal line in the display panel can be configured. For example, the first electrode plate 641*a* or the second electrode plate 641*b* of the first compensation capacitor 641 is configured to be floating, which is equivalent to disconnect the repair signal line from the first compensation capacitor 641.

Figure 20:
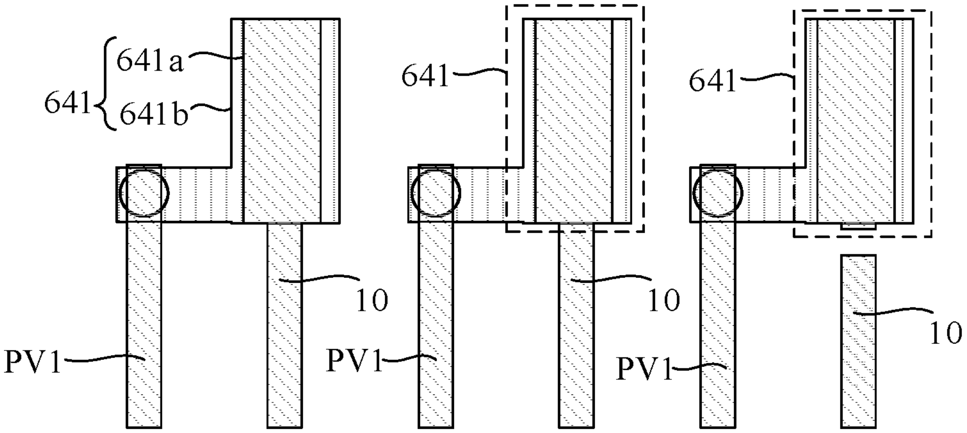
FIG. 20 is a partial view of a display panel according to an embodiment of the present disclosure.

In an embodiment, taking the first constant-voltage signal line including the first power supply signal line PV1 as an example, FIG. 20 is a partial view of a display panel according to an embodiment of the present disclosure. FIG. 20 schematically shows three first compensation capacitors 641 and corresponding signal lines 10 thereto. A first electrode plate 641*a* of the 3rd first compensation capacitor 641 from left to right is not coupled to the signal line 10, that is, the first electrode plate 641*a* is floating, and a second electrode plate 641*b* of the 3rd first compensation capacitor 641 from left to right is coupled to the first power supply signal line PV1. First electrode plates 641*a* of the 1st and 2nd first compensation capacitors 641 from left to right are coupled to the signal lines 10, and second electrode plates 641*b* are coupled to the first power supply signal lines PV1. The signal line 10 corresponding to the 3rd first compensation capacitor 641 is a repair signal line. The first electrode plates 641*a* are all coupled to the signal lines 10 after the display panel is manufactured. After it is determined, through defect detection, that there is a defective pixel in the display panel, the display panel is repaired. A signal line 10 corresponding to the defective pixel is configured to be not coupled to a first compensation capacitor 641, and the first electrode plate 641*a* is disconnected from the signal line 10 with a laser fusion process, to form the structure shown in FIG. 18.

Figure 21:
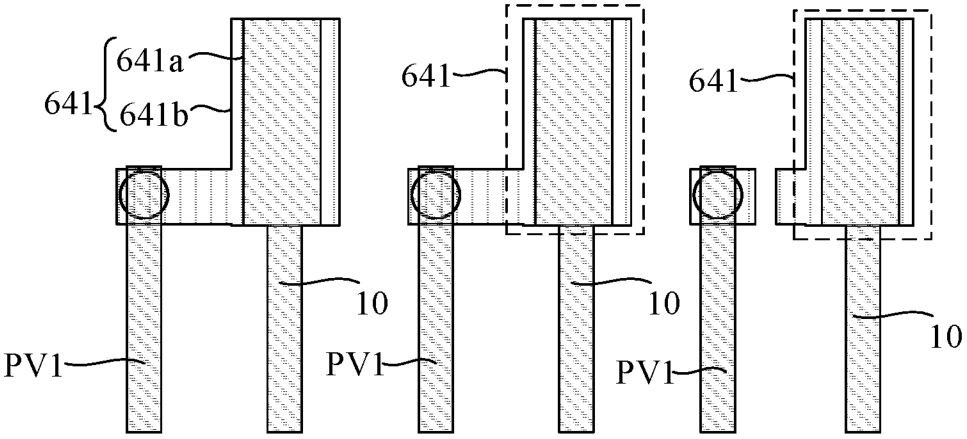
FIG. 21 is a partial view of a display panel according to an embodiment of the present disclosure.

In another embodiment, taking the first constant-voltage signal line including the first power supply signal line PV1 as an example, FIG. 21 is a partial view of a display panel according to an embodiment of the present disclosure. FIG. 21 schematically shows three first compensation capacitors 641 and corresponding signal lines 10 thereto. A first electrode plate 641*a* of the first compensation capacitor 641 is coupled to a corresponding signal line 10, second electrode plates 641*b* of the 1st and 2nd first compensation capacitors 641 from left to right are coupled to first power supply signal lines PV1, and a second electrode plate 641*b* of the 3rd first compensation capacitor 641 from left to right is not coupled to a first power supply signal line PV1, that is, the second electrode plate 641*b* of the 3rd first compensation capacitor 641 is floating. In this implementation, it can be regarded that the 3rd first compensation capacitor 641 is not coupled to the corresponding signal line 10. The signal line 10 corresponding to the 3rd first compensation capacitor 641 is a repair signal line. After it is determined, through defect detection, that there is a defective pixel in the display panel, the display panel is repaired. A signal line 10 corresponding to the defective pixel is configured to be not coupled to a first compensation capacitor 641, and the second electrode plate 641*b* is disconnected from the first power supply signal line PV1 with the laser fusion process, to form the structure shown in FIG. 19.

Figure 22:
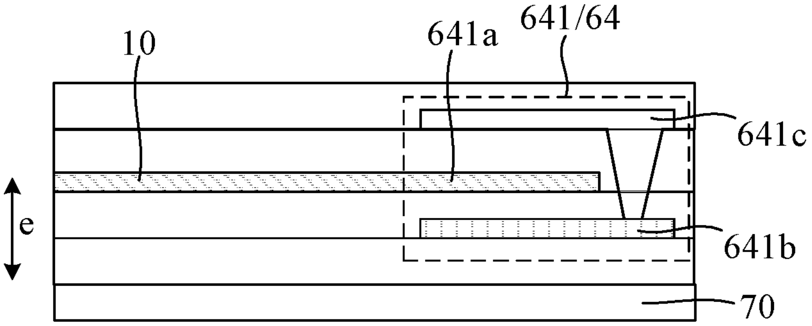
FIG. 22 is a partial view of a display panel according to an embodiment of the present disclosure.

FIG. 22 is a partial schematic view of another display panel according to an embodiment of the present disclosure. In some embodiments, as shown in FIG. 22, a first compensation capacitor 641 includes a first electrode plate 641*a*, a second electrode plate 641*b*, and a third electrode plate 641*c*. The first electrode plate 641*a* is located between the second electrode plate 641*b* and the third electrode plate 641*c*, and the second electrode plate 641*b* is coupled to the third electrode plate 641*c*. In this way, capacitance of the first compensation capacitor 641 can be increased, the area of the first compensation capacitor 641 can be reduced, and the first compensation capacitors 641 corresponding to different signal lines 10 are insulated from each other when the space available for disposing the compensation capacitors in the display panel is limited.

Figure 23:
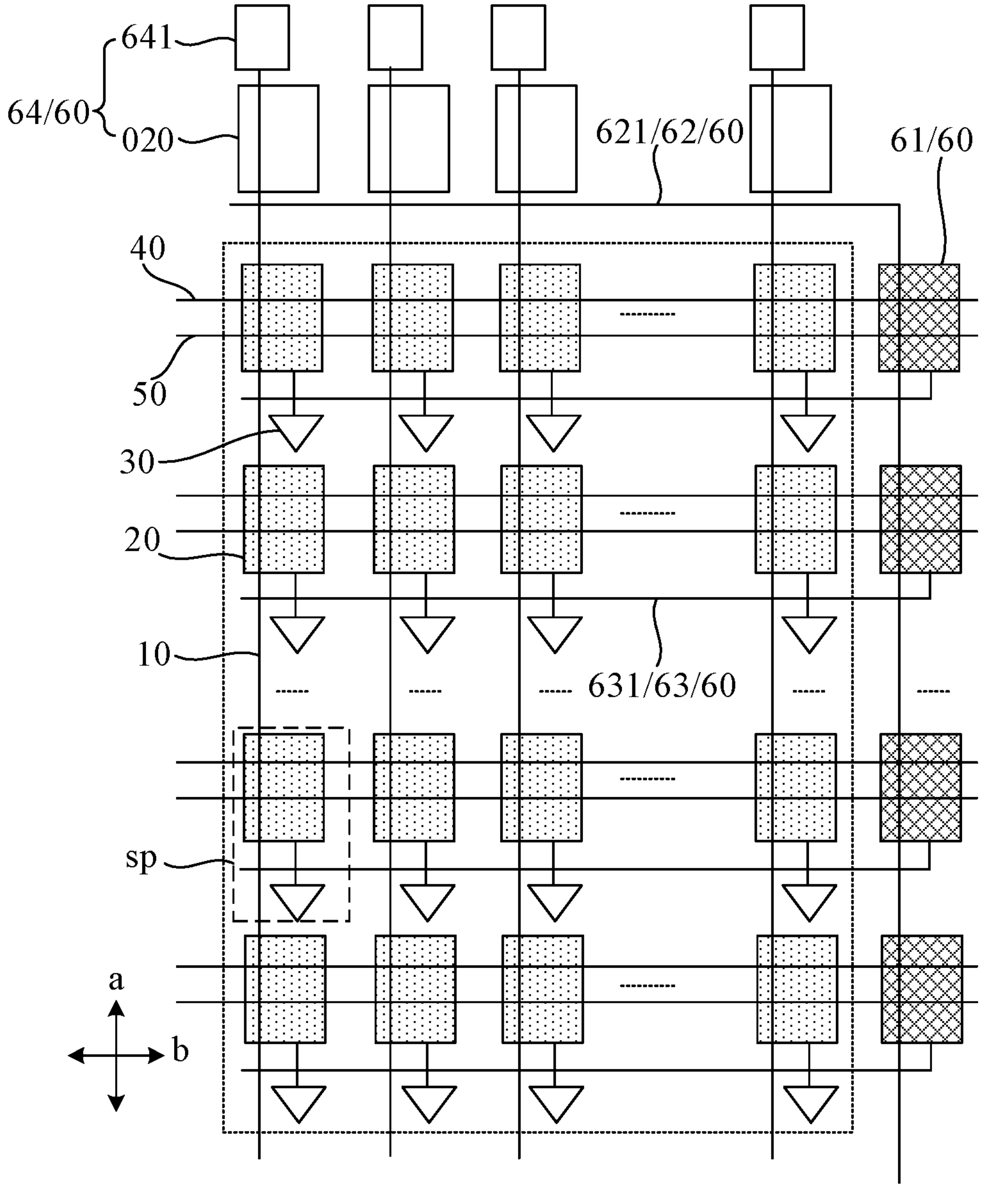
FIG. 23 is a schematic diagram of a display panel according to an embodiment of the present disclosure.

FIG. 23 is a schematic diagram of a display panel according to an embodiment of the present disclosure. In some embodiments, as shown in FIG. 23, the display panel includes dummy pixel circuits 020, the structure of the dummy pixel circuit 020 is the same as the structure of the first pixel circuit 20, and the dummy pixel circuit 020 and the first pixel circuit 20 are manufactured in a same process. The dummy pixel circuits 020 are located at the periphery of the array-arranged first pixel circuits 20, and the dummy pixel circuits 020 are provided to prevent uneven etching of the dummy pixel circuits 020 due to abrupt graphic changes in the etching process when the pixel circuits are manufactured, such that stable performance of the manufactured first pixel circuit 20 can be ensured. The dummy pixel circuits 020 are configured to not emit light. The structure of the light-emitting device corresponding to the dummy pixel circuit 020 is incomplete. For example, the light-emitting device corresponding to the dummy pixel circuit 020 lacks an electrode layer or a light-emitting layer; or the dummy pixel circuit 020 is not coupled to the light-emitting device. The dummy pixel circuit 020 in FIG. 23 is shown in a block diagram. In an implementation, a first compensation structure 64 further includes a first compensation capacitor 641 and at least one dummy pixel circuit 020, and the dummy pixel circuit 020 is located at a side of the first compensation capacitor 641 close to the first pixel circuit 20.

As shown in FIG. 2, a plurality of first pixel circuits 20 are arranged in a pixel circuit row 20H in the second direction b, and one second repair assembly 63 corresponds to at least two light-emitting devices 30. That is, in the direction perpendicular to the plane of the substrate 70, one second repair assembly 63 overlaps at least two light-emitting devices 30. The overlapping between the second repair assembly 63 and the light-emitting devices 30 can be achieved with reference an overlapping manner between the second repair spacer 632 and the first electrode 31, which is shown in FIG. 14. In the embodiment of the present disclosure, first pixel circuits 20 corresponding to the light-emitting devices 30 overlapping a same second repair assembly 63 are located in a same pixel circuit row 20H, and one of multiple pixels sp can be repaired by the second repair assembly 63 and the second pixel circuit 61 coupled to the second repair assembly 63.

In some implementations, light-emitting devices 30 in at least two pixels sp to which the first pixel circuits 20 in a same pixel circuit row 20H belong all overlap a same second repair assembly 63.

Figure 24:
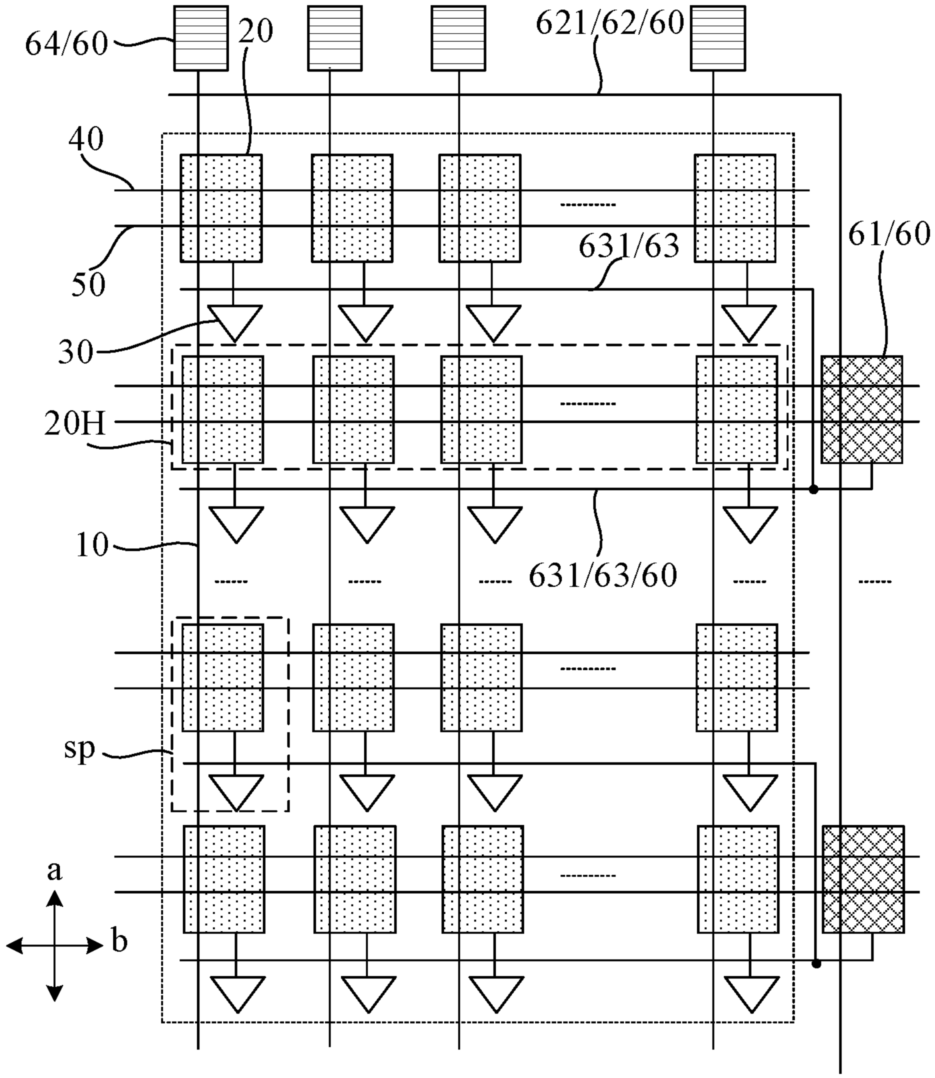
FIG. 24 is a schematic diagram of a display panel according to an embodiment of the present disclosure.

In some embodiments, an output terminal of one second pixel circuit 61 is coupled to at least two second repair lines 631. FIG. 24 is a schematic diagram of a display panel according to an embodiment of the present disclosure. As shown in FIG. 24, an output terminal of a second pixel circuit 61 is coupled to two second repair lines 631, one second repair assembly 63 includes one second repair line 631, and the second repair assembly 63 overlaps multiple light-emitting devices 30 corresponding to one pixel circuit row 20H. In the implementation, one second pixel circuit 61 can repair one of the pixels sp corresponding to two pixel circuit rows 20H, which can reduce the number of the second pixel circuits 61, thereby reducing the space of the second pixel circuits 61. When the second pixel circuits 61 are disposed in a non-display region, the bezel of the display panel can be narrowed.

When there is a defective pixel in the display panel, a first repair line 621 is configured to be coupled to a repair signal line and not coupled to a non-repair signal line, a second repair line 631 is configured to be coupled to a light-emitting device 30 of the defective pixel, and the repair signal line is configured to be not coupled to a corresponding first compensation structure 64. In this way, the second pixel circuit 61 can drive the light-emitting device 30 of the defective pixel, parasitic capacitance on the signal lines 10 is basically the same, voltage drops of the signal lines are basically the same, thereby ensuring display uniformity. As shown in FIG. 2, one first repair line 621 is connected to first input terminals of at least two second pixel circuits 61. In this way, the number of the first repair lines 621 can be reduced, thereby reducing wiring space in the display panel.

As shown in FIG. 2, multiple second pixel circuits 61 are arranged in a repair circuit column 61L in the first direction a, and the repair circuit column 61L is connected to a same first repair line 621. Only one first repair line 621 can be provided for one repair circuit column 61L, which reduces the number of the first repair lines 621 and reduces wiring space in the display panel. The number of the second pixel circuits 61 in the repair circuit column 61L is set to be the same as the number of the pixel circuit rows 20H in the display panel, and one second pixel circuit 61 corresponds to one pixel circuit row 20H. When a first pixel circuit 20 in any one-pixel circuit row 20H is defective, a corresponding second pixel circuit 61 can be used to replace the first pixel circuit 20, to drive a corresponding light-emitting device 30 to emit light.

Figure 25:
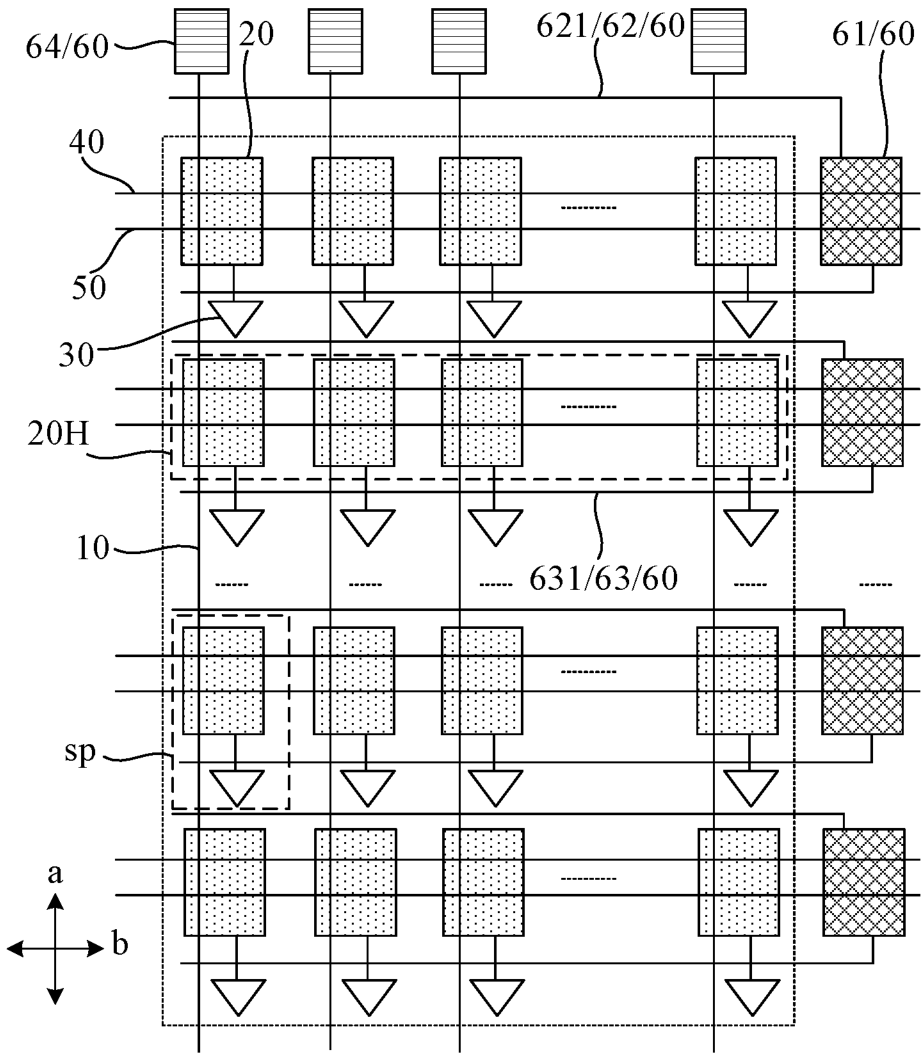
FIG. 25 is a schematic diagram of a display panel according to an embodiment of the present disclosure.

FIG. 25 is a schematic diagram of a display panel according to an embodiment of the present disclosure. In some embodiments, as shown in FIG. 25, one first repair line 621 is connected to one second pixel circuit 61. Among the pixel repair structure 60, one first repair line 621, one second pixel circuit 61, and a second repair line 631 coupled to an output terminal of the second pixel circuit 61 belong to one repair group, and the repair group repairs one defective pixel in the display panel. If there are multiple repair groups formed by the pixel repair structures 60, multiple defective pixels can be repaired simultaneously. Each first repair line 621 shown in FIG. 25 is not coupled to the signal lines 10, and each second repair line 631 is not coupled to the light-emitting devices 30. There is no defective pixel in the display panel.

Figure 26:
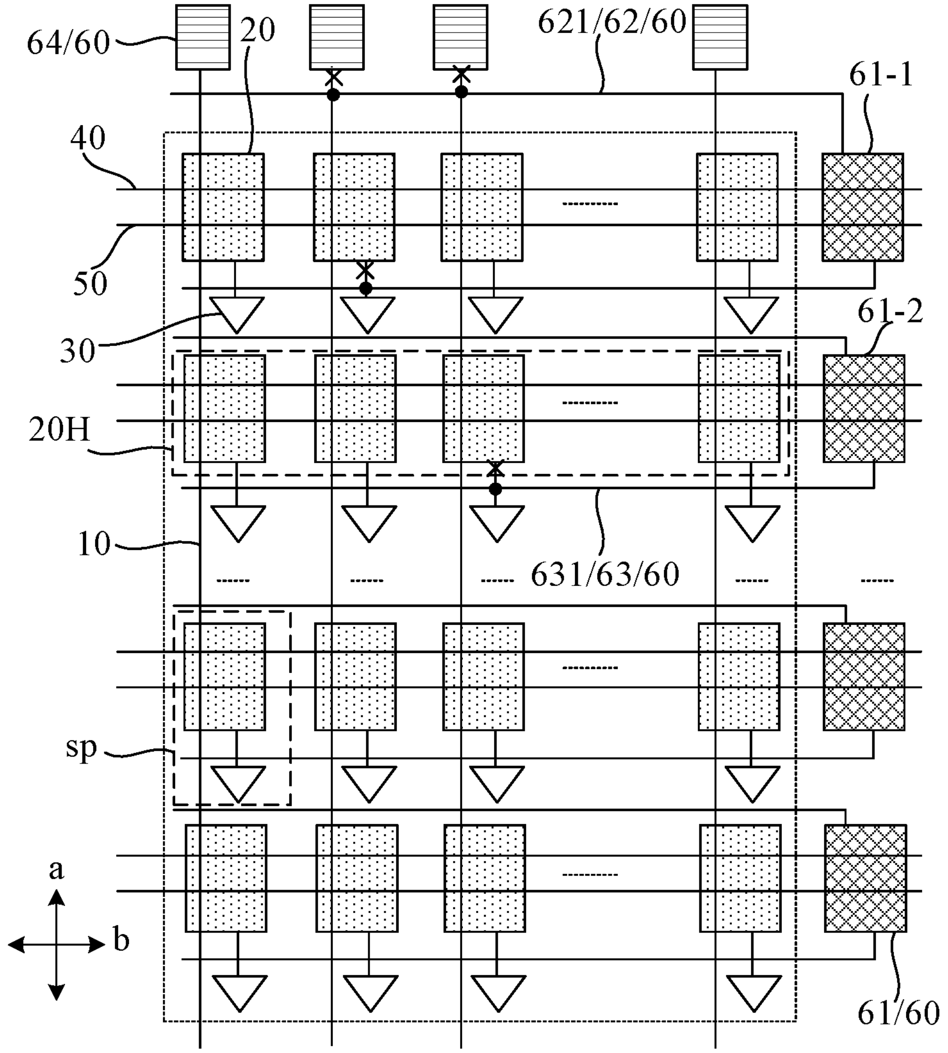
FIG. 26 is a schematic diagram of a display panel according to an embodiment of the present disclosure.

FIG. 26 is a schematic diagram of a display panel according to an embodiment of the present disclosure. As shown in FIG. 26, a first pixel circuit 20 (1, 2) in the second column and the first row of the display panel is defective, and a first pixel circuit 20 (2, 3) in the third column and the second row of the display panel is defective. A signal line 10 corresponding to the first pixel circuit 20 (1, 2) is not coupled to a first compensation structure 64, a first repair line 621 coupled to the 1st second pixel circuit 61-1 is coupled to the signal line 10 corresponding to the first pixel circuit 20 (1, 2), and a second repair line 631 coupled to the 1st second pixel circuit 61-1 is coupled to a light-emitting device 30 of a pixel sp to which the first pixel circuit 20 (1, 2) belongs. A signal line 10 corresponding to the first pixel circuit 20 (2, 3) is not coupled to a first compensation structure 64, a first repair line 621 coupled to the 2nd second pixel circuit 61-2 is coupled to the signal line 10 corresponding to the first pixel circuit 20 (2,3), and a second repair line 631 coupled to the 2nd second pixel circuit 61-2 is coupled to a light-emitting device 30 of a pixel sp to which the first pixel circuit 20 (1,3) belongs. This implementation can repair two defective pixels simultaneously.

Figure 27:
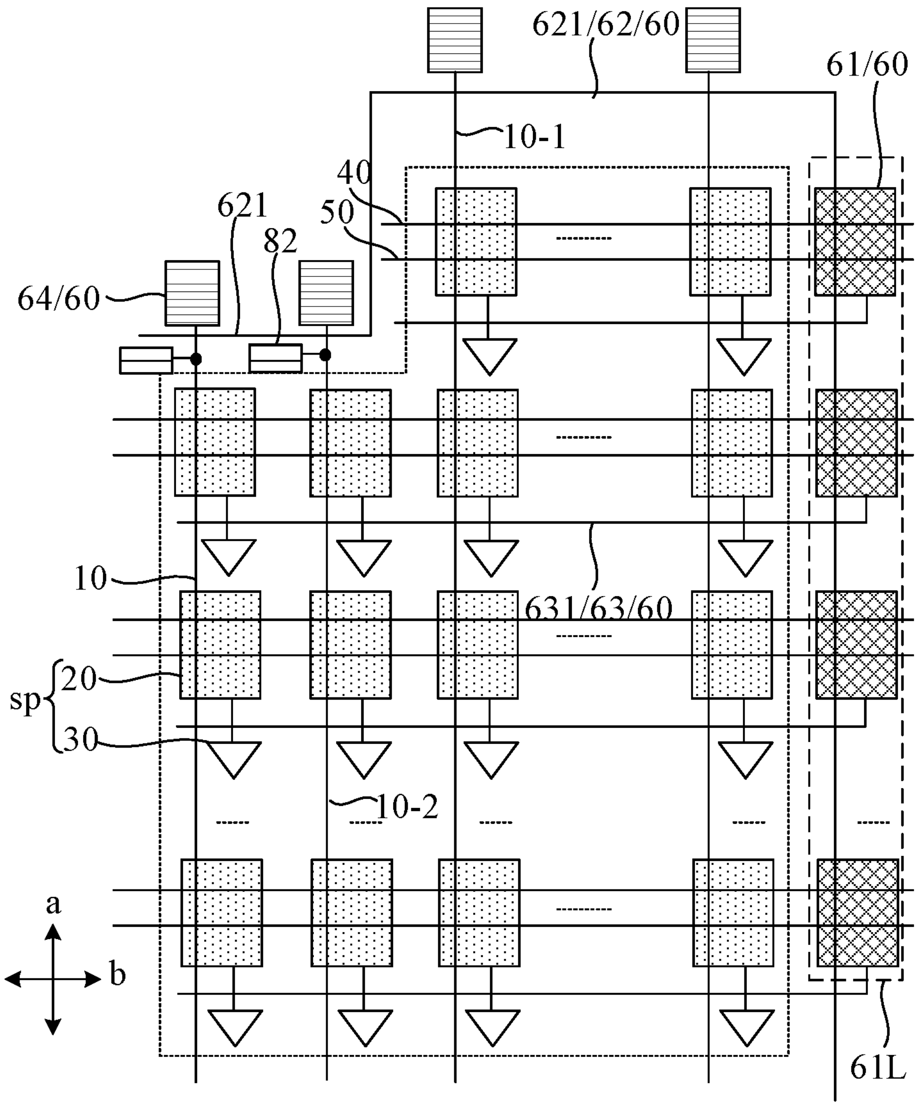
FIG. 27 is a schematic diagram of a display panel according to an embodiment of the present disclosure.

FIG. 27 is a schematic diagram of a display panel according to an embodiment of the present disclosure. In some embodiments, as shown in FIG. 27, the signal lines 10 include first signal lines 10-1 and second signal lines 10-2, n1 first pixel circuits 20 are coupled to the first signal lines 10-1, and n2 first pixel circuits 20 are coupled to the second signal lines 10-2, where n1 is greater than n2. The display panel further includes a second compensation structure 82, and the second signal line 10-2 is electrically connected to the second compensation structure 82. The embodiment of the present disclosure can be applied to a special-shaped display panel, such as a circular display panel or a display panel with notches in the display region. In the special-shaped display panel, the first signal line 10-1 and the second signal line 10-2 are coupled to different quantities of first pixel circuits 20, and loads generated by the first pixel circuits 20 on the first signal line 10-1 and the second signal line 10-2 is different. In the embodiment, load on the second signal line 10-2 is compensated by the second compensation structure 82, to reduce a load difference between the first signal line 10-1 and the second signal line 10-2. A first compensation structure 64 is provided for each of the first signal lines 10-1 and the second signal lines 10-2. When a first pixel circuit 20 corresponding to the first signal line 10-1 or the second signal line 10-2 is defective, the pixel repair structures 60 can be configured to repair a light-emitting device 30 corresponding to the defective first pixel circuit 20. After such repair, parasitic capacitance on the signal lines 10 are basically the same, which improves the display effect after such repair.

In some implementations, the second compensation structure 82 includes a compensation capacitor. The second compensation structure 82 can be a capacitor including two opposite electrode plates. When a capacitance value to be compensated is large, the second compensation structure 80 can be set as a capacitor including three electrode plates overlapping each other in a direction perpendicular to the plane of the substrate 70.

Figure 28:
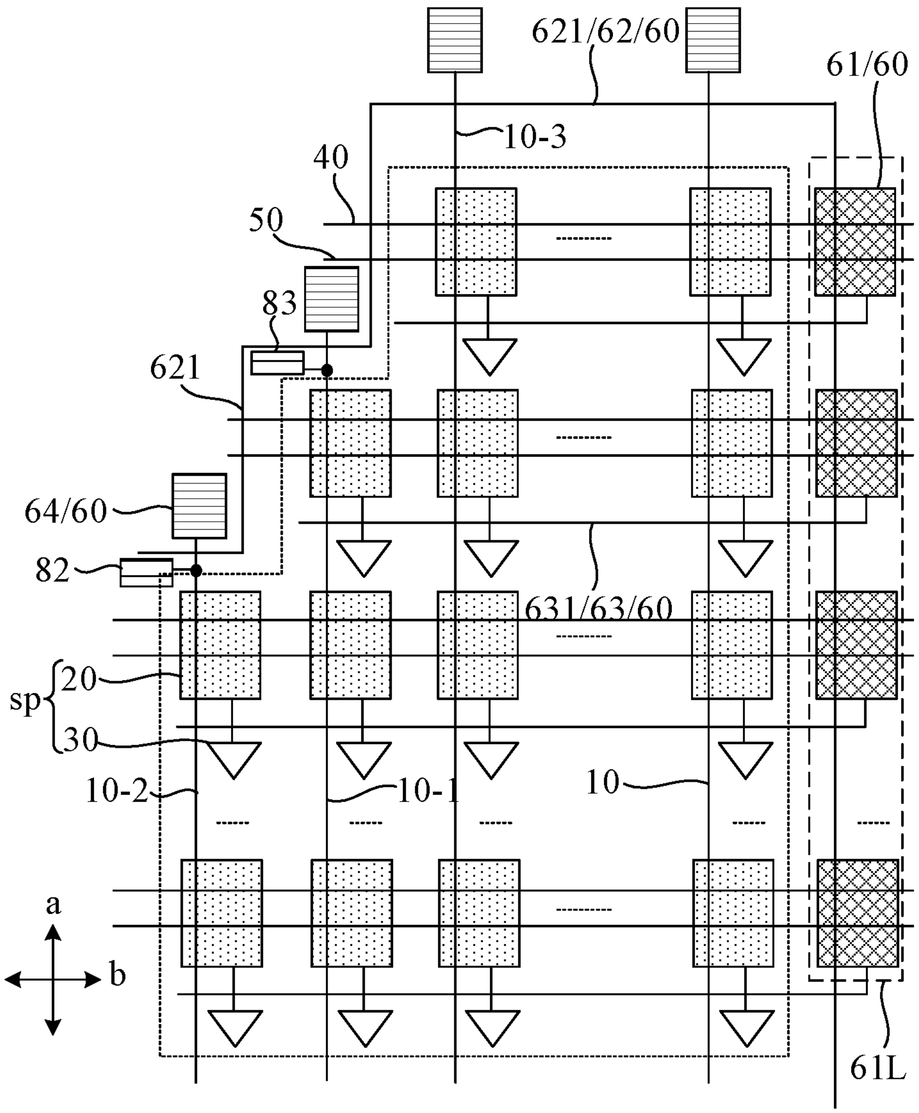
FIG. 28 is a schematic diagram of a display panel according to an embodiment of the present disclosure.

FIG. 28 is a schematic diagram of a display panel according to an embodiment of the present disclosure. In some embodiments, as shown in FIG. 28, signal lines 10 include a first signal line 10-1 and a second signal line 10-2, a quantity of first pixel circuits 20 coupled to the first signal line 10-1 is greater than a quantity of first pixel circuits 20 coupled to the second signal line 10-2. The display panel further includes third signal lines 10-3*s*, and a quantity of first pixel circuits 20 coupled to the third signal line 10-3 is greater than the quantity of first pixel circuits 20 coupled to the first signal line 10-1. The display panel includes a second compensation structure 82 and a third compensation structure 83, the second signal line 10-2 is electrically connected to the second compensation structure 82, the first signal line 10-1 is electrically connected to the third compensation structure 83, and a capacitance value that the third compensation structure 83 can compensate is smaller than a capacitance value that the second compensation structure 82 can compensate. The quantity of first pixel circuits 20 coupled to the first signal line 10-1 and the quantity of the second signal line 10-2 each are smaller than the quantity of first pixel circuits 20 coupled to the third signal line 10-3, and the load generated by the first pixel circuits 20 on the first signal line 10-1, the second signal line 10-2 and the third signal line 10-3 is different. In the embodiment of the present disclosure, the second compensation structure 82 is configured to compensate the load on the second signal line 10-2, and the third compensation structure 83 is configured to compensate the load on the first signal line 10-1. The capacitance values that the compensation structures can compensate are designed based on the difference in the quantities of first pixel circuits 20 coupled to the signal lines, to reduce the difference between the load on the first signal line 10-1 and the load on the third signal lines 10-3, and the difference between the load on the second signal line 10-2 and the load on the third signal lines 10-3. A first compensation structure 64 is provided for each of the first signal line 10-1, the second signal line 10-2, and the third signal lines 10-3. When a first pixel circuit 20 corresponding to the first signal line 10-1, the second signal line 10-2, or the third signal lines 10-3 is defective, the pixel repair structures 60 can be configured to repair a light-emitting device 30 corresponding to the defective first pixel circuit 20. After such repair, parasitic capacitance on the signal lines 10 is basically the same, which improves the display effect after repair.

In some embodiments, as shown in FIG. 2, the display panel includes a display region AA and a non-display region BA. The light-emitting devices 30 and the first pixel circuits 20 are located in the display region AA, and the second pixel circuits 61 are located in the non-display region BA. Multiple second pixel circuits 61 are arranged in a repair circuit column 61L in the first direction a. In the implementation, the second pixel circuits 61 are disposed in the non-display region BA and do not occupy the space of the display region AA, thereby not affecting the arrangement of the first pixel circuits 20 in the display region AA. When the second pixel circuits 61 are disposed in the non-display region BA, one second pixel circuit 61 can correspond to one or more pixel circuit rows 20H, such that one second pixel circuit 61 can repair one of the plurality of pixels sp.

In some embodiments, the first compensation structures 64 are located in the non-display region BA, thus not affecting the arrangement of the first pixel circuits 20 in the display region AA.

Figure 29:
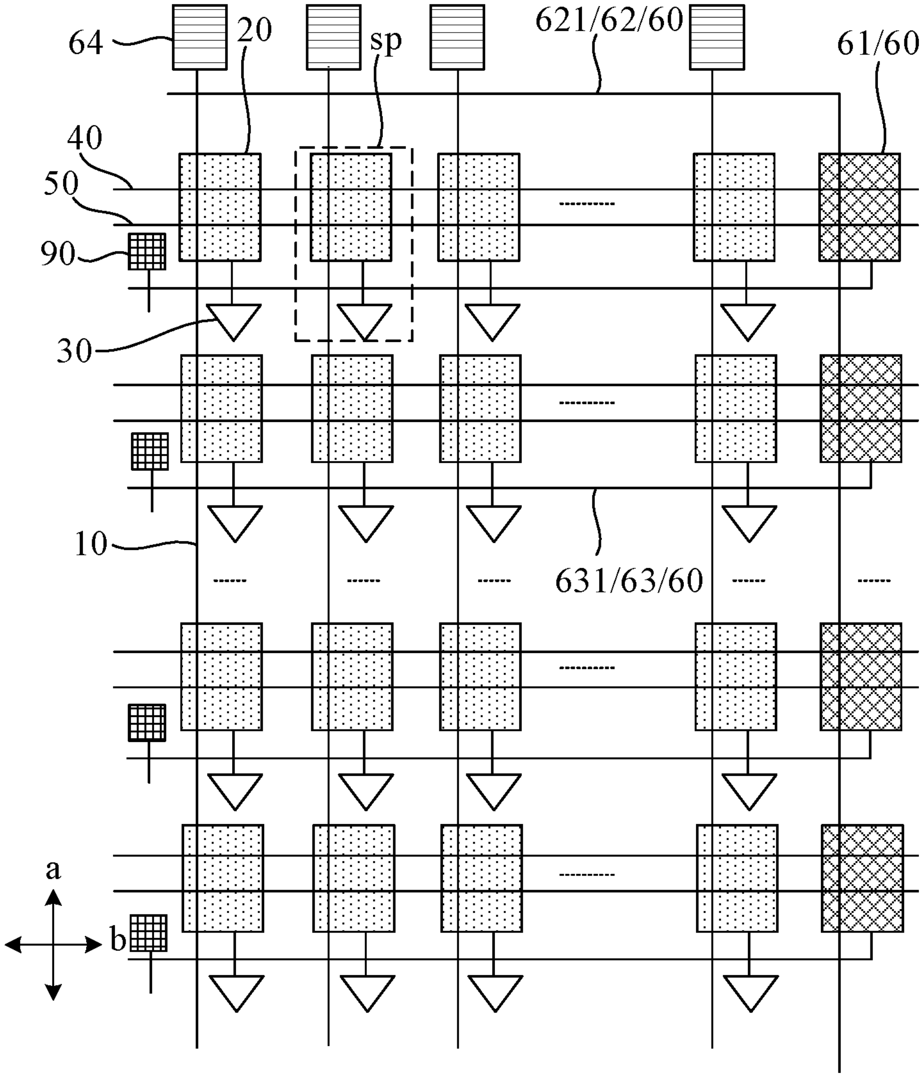
FIG. 29 is a schematic diagram of a display panel according to an embodiment of the present disclosure.

FIG. 29 is a schematic diagram of a display panel according to an embodiment of the present disclosure. In some embodiments, as shown in FIG. 29, the display panel further includes protection structures 90. An input terminal of the protection structure 90 is connected to a second constant-voltage signal line (not shown in FIG. 29), and the second constant-voltage signal line transmits a second constant-voltage signal. In the direction perpendicular to the plane of the substrate 70, a second repair line 631 overlaps a signal output terminal of the protection structure 90.

In an embodiment of the present disclosure, in the direction perpendicular to the plane of the substrate 70, a second repair assembly 63 overlaps at least one light-emitting device 30, and it is necessary to dispose the second repair assembly 63 in a display region AA, that is, the second repair line 631 in the second repair assembly 63 is located in the display region AA. Because scanning lines, light-emitting control lines, and other signal lines are provided in the display region AA, there are signal jumps on the scanning lines and light-emitting control lines when the display panel is driven for display, and the voltage on the second repair line 631 is affected by the signal jumps on the surrounding signal lines, increasing potential on the second repair line 631 by coupling. Because the second repair line 631 is close to the light-emitting device 30, after the potential on the second repair line 631 is increased by coupling, potential of a first electrode 31 of the light-emitting device 30 is affected, resulting in a risk of unexpected illumination of the light-emitting device 30. In order to resolve this problem, in the embodiment of the present disclosure, the protection structures 90 are provided. In some embodiments, the second repair assembly 63 is not coupled to the light-emitting device 30 overlapped with it, and the signal output terminal of the protection structure 90 overlaps and is coupled to the second repair line 631. In this way, the protection structure 90 can stabilize the potential on the second repair line 631, to prevent the potential on the second repair line 631 from increasing by coupling, thereby reducing the risk of unexpected illumination of the light-emitting device 30.

In other embodiments, the second repair assembly 63 is coupled to the light-emitting device 30 overlapping the second repair assembly 63, and the signal output terminal of the protection structure 90 overlaps but is not coupled to the second repair line 631.

Figure 30:
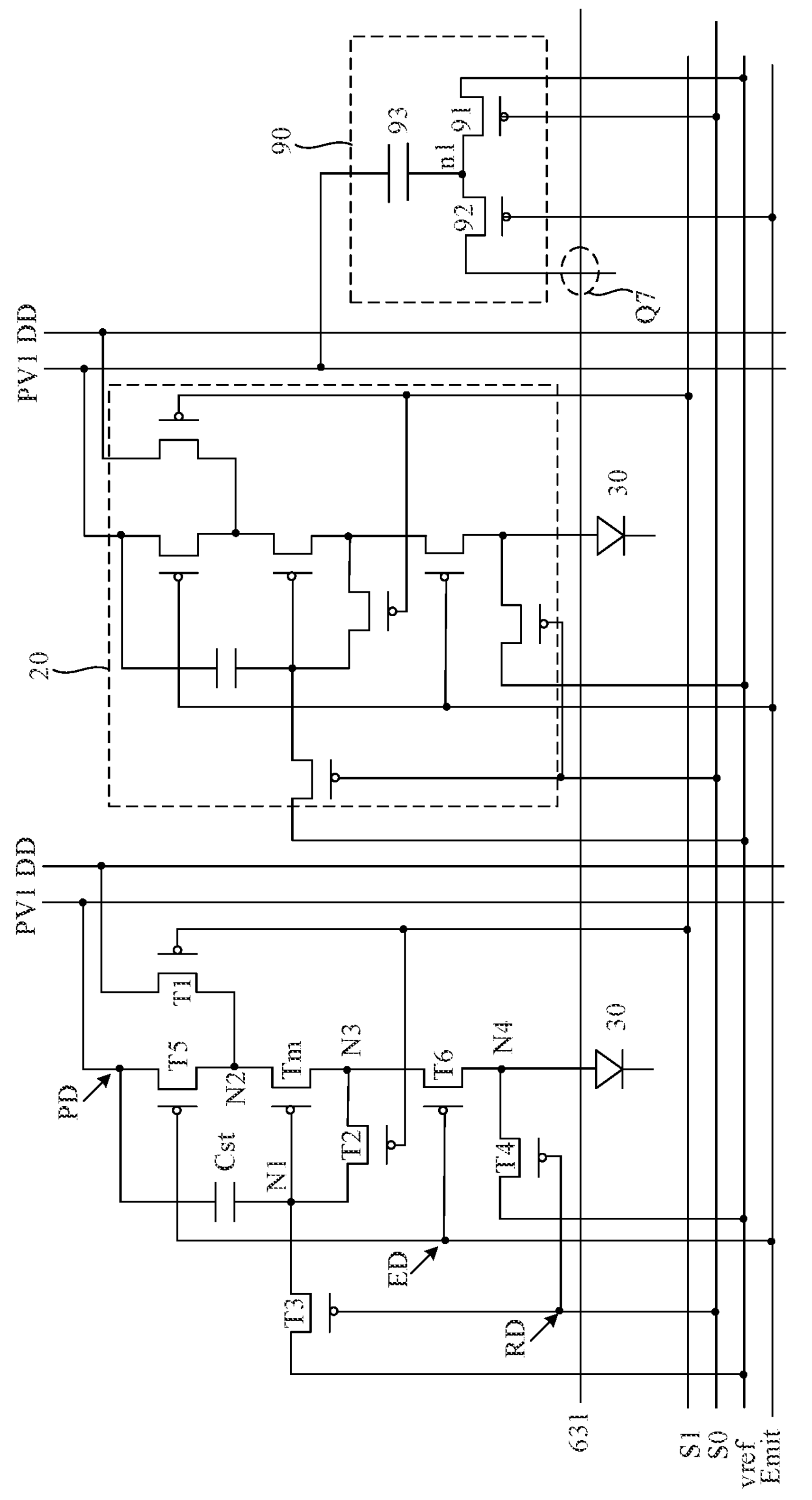
FIG. 30 is a schematic diagram of a circuit structure in a display panel according to an embodiment of the present disclosure.

FIG. 30 is a schematic diagram of a circuit structure in a display panel according to an embodiment of the present disclosure. In some embodiments, as shown in FIG. 30, the display panel includes a first reset control line S0, a light-emitting control line Emit, a first power supply signal line PV1, a data line DD, a first scanning line S1, and a reset signal line vref. A first pixel circuit 20 includes a first reset control terminal RD, a light-emitting control terminal ED, and a power supply signal terminal PD. The first reset control terminal RD is coupled to the first reset control line S0, the light-emitting control terminal ED is coupled to the light-emitting control line Emit, and the power supply signal terminal PD is coupled to the first power supply signal line PV1. With reference to the description in the embodiment of FIG. 3, the gate of the gate reset transistor T3 and the gate of the electrode reset transistor T4 are coupled to the first reset control terminal RD, and the first electrode of the gate reset transistor T3 and the first electrode of the electrode reset transistor T4 are coupled to the reset signal line vref. The gate of the first light-emitting control transistor T5 and the gate of the second light-emitting control transistor T6 are coupled to the light-emitting control terminal ED, and the first electrode of the first light-emitting control transistor T5 and one electrode plate of the storage capacitor Cst are coupled to the power supply signal terminal PD. The gate of the data writing transistor T1 and the gate of the threshold compensation transistor T2 are coupled to the first scanning line S1.

A protection structure 90 includes a second transistor 91, a third transistor 92, and a first capacitor 93. A control electrode of the second transistor 91 is coupled to the first reset control line S0, a first electrode of the second transistor 91 is coupled to a second constant-voltage signal line, and a second electrode of the second transistor 91 is coupled to a first node n1. FIG. 30 schematically shows that the reset signal line vref in the display panel is reused as the second constant-voltage signal line, that is, the first electrode of the second transistor 91 is coupled to the reset signal line vref. No additional signal line is provided in the display panel. A control electrode of the third transistor 92 is coupled to the light-emitting control line Emit, and a first electrode of the third transistor 92 is coupled to the first node n1. As shown in an area Q7 in FIG. 30, the second electrode of the third transistor 92 overlaps a second repair line 632. One electrode plate of the first capacitor 93 is coupled to the first node n1, and another electrode plate is coupled to the first power supply signal line PV1.

In the implementation, the protection structure 90 is controlled to operate by the first reset control line S0 and the light-emitting control line Emit that drive the first pixel circuit 20 to operate. When the signal output terminal of the protection structure 90 overlaps and is coupled to the second repair line 631, first, the first reset control line S0 provides an enabling signal to control the second transistor 91 to be turned on, and a reset signal provided by the reset signal line vref is written to the first node n1; then the light-emitting control line Emit provides an enabling signal to control the third transistor 92 to be turned on, and a voltage signal of the first node n1 is provided to the second repair line 631, such that the second repair line 631 maintains a relatively stable potential, to prevent the potential on the second repair line 631 from increasing by coupling, thereby reducing the risk of unexpected illumination of the light-emitting device 30.

The embodiment of FIG. 30 shows that the gate of the gate reset transistor T3 and the gate of the electrode reset transistor T4 are coupled to the first reset control terminal RD. In some embodiments, the gate of the gate reset transistor T3 and the gate of the electrode reset transistor T4 are coupled to different reset control terminals.

The embodiment of FIG. 30 shows that the first electrode of the gate reset transistor T3 and the first electrode of the electrode reset transistor T4 are coupled to a same reset signal line vref. In some embodiments, the first electrode of the gate reset transistor T3 and the first electrode of the electrode reset transistor T4 are coupled to different reset signal lines.

Figure 31:
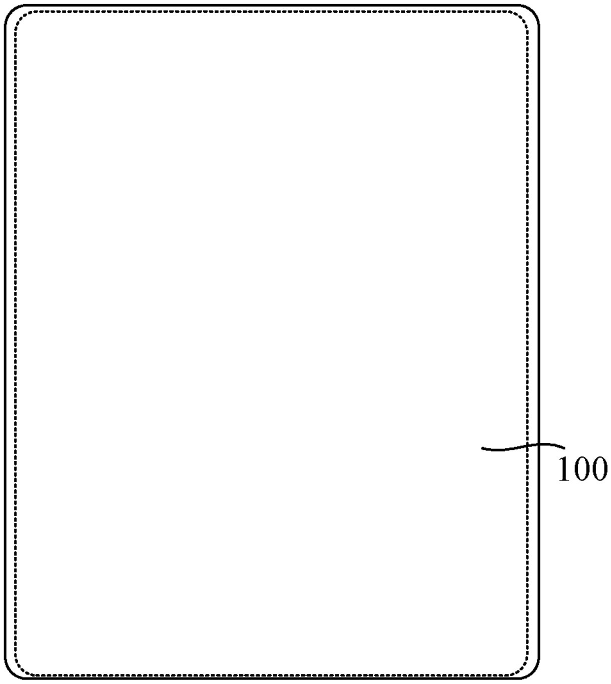
FIG. 31 is a schematic diagram of a display apparatus according to an embodiment of the present disclosure.

An embodiment of the present disclosure further provides a display apparatus. FIG. 31 is a schematic diagram of a display apparatus according to an embodiment of the present disclosure. As shown in FIG. 31, the display apparatus includes the display panel 100 provided in any embodiment of the present disclosure. The structure of the display panel has been described in the foregoing embodiments, and details are not described herein again. In an embodiment of the present disclosure, the display apparatus can be, for example, any devices having a display function, such as a mobile phone, a tablet computer, a notebook computer, an electronic paper book, a television, or an intelligent watch.

The above description merely illustrates some embodiments of the present disclosure, and is not intended to limit the present disclosure. Any modifications, equivalent replacements, improvements, and the like made within the principle of the present disclosure shall fall within the protection scope of the present disclosure.

Finally, it should be noted that the foregoing embodiments are merely intended to describe and not to limit the technical solutions of the present disclosure. Although the present disclosure has been described in detail with reference to the foregoing embodiments, persons skilled in the art should understand that they can still make modifications to the technical solutions described in the foregoing embodiments or make equivalent replacements to some or all of the technical features thereof. These modifications or replacements do not make the essence of the corresponding technical solutions deviate from the scope of the technical solutions of the embodiments of the present disclosure.

What is claimed is:

1. A display panel, comprising:

a display region and a non-display region;

a substrate;

pixels and signal lines, wherein the signal lines are scanning lines, the pixels and the signal lines are located at a side of the substrate, at least one of the pixels comprises a first pixel circuit and a light-emitting device that are located in the display region, at least one of the signal lines extends in a first direction, and the signal lines are coupled to the first pixel circuits of the pixels; and pixel repair structures comprising second pixel circuits, at least one first repair assembly, at least one second repair assembly, and first compensation structures, wherein the second pixel circuits and the first compensation structures are located in the non-display region, and the first compensation structures comprise at least one first compensation capacitor, wherein the first compensation structures are coupled to the signal lines in a one-to-one correspondence and are disconnectable from their corresponding signal lines;

wherein in a direction perpendicular to a plane of the substrate, one of the at least one first repair assembly partially overlaps at least one signal line of the signal lines, and one of the at least one second repair assembly partially overlaps at least one of the light-emitting devices of the pixels; and wherein the at least one first repair assembly comprises a first repair line, the at least one second repair assembly comprises at least one second repair line, and one of the second pixel circuits comprises a first input terminal coupled to the first repair line, and an output terminal that is coupled to at least one of the at least one second repair line.

2. The display panel according to claim 1, wherein one of the at least one first compensation capacitor comprises a first electrode plate coupled to one of the signal lines, and a second electrode plate coupled to a first constant-voltage signal line; and the first constant-voltage signal line is configured to transmit a constant-voltage signal.

3. The display panel according to claim 1, wherein one of the at least one first compensation capacitor comprises a first electrode plate and a second electrode plate; and the first electrode plate of one first compensation capacitor of the first compensation capacitors of the first compensation structures is floating, and the second electrode plate of the one first compensation capacitor is coupled to a first constant-voltage signal line configured to transmit a first constant-voltage signal.

4. The display panel according to claim 1, wherein the at least one first compensation capacitor comprises at least two first compensation capacitor, one of the at least two first compensation capacitor comprises a first electrode plate and a second electrode plate; and the first electrode plate of one first compensation capacitor of the at least two first compensation capacitors is coupled to one of the signal lines, and the second electrode plate of the one first compensation capacitor is floating.

5. The display panel according to claim 1, wherein one of the at least one first compensation capacitor comprises a first electrode plate, a second electrode plate, and a third electrode plate, wherein the first electrode plate is located between the second electrode plate and the third electrode plate, and the second electrode plate is coupled to the third electrode plate.

6. The display panel according to claim 1, wherein the first compensation structures further comprise at least one dummy pixel circuit located at a side of the first compensation capacitor close to the first pixel circuit, wherein each of the at least one dummy pixel circuit is configured to not emit light and not display images.

7. The display panel according to claim 1, wherein the first repair line is located in a layer different from the signal lines; and the first repair line partially overlaps at least one of the signal lines in the direction perpendicular to the plane of the substrate.

8. The display panel according to claim 1, wherein the at least one first repair assembly further comprises a first transistor, and one of the signal lines partially overlaps the first transistor in the direction perpendicular to the plane of the substrate; and the first repair line is coupled to one of the signal lines through the first transistor.

9. The display panel according to claim 1, wherein the first repair line and the signal lines are located in a same layer, and the at least one first repair assembly further comprises a first repair spacer located in a different layer from the first repair line; and the first repair spacer has one end overlapping the first repair line in the direction perpendicular to the plane of the substrate, and another end overlapping one of the signal lines in the direction perpendicular to the plane of the substrate.

10. The display panel according to claim 1, wherein the light-emitting device comprises a first electrode, a light-emitting layer, and a second electrode that are stacked;

the at least one second repair assembly further comprises a second repair spacer located in a different layer from the at least one second repair line; and the second repair spacer has one end overlapping the first electrode, and another end overlapping one of the at least one second repair line.

11. The display panel according to claim 1, wherein at least two of the first pixel circuits are arranged in one of pixel circuit rows in a second direction, and the second direction intersects the first direction; and one of the at least one second repair assembly overlaps at least two light-emitting devices of at least two pixels of the pixels in the direction perpendicular to the plane of the substrate, wherein at least two first pixel circuits of the at least two pixels are located in one of the pixel circuit rows.

12. The display panel according to claim 11, wherein the at least one second repair line comprises at least two second repair lines, and the output terminal of the one of the second pixel circuits is coupled to the at least two second repair lines.

13. A display panel, comprising:

a display region and a non-display region;

a substrate;

pixels and signal lines, wherein the pixels and the signal lines are located at a side of the substrate, at least one of the pixels comprises a first pixel circuit and a light-emitting device that are located in the display region, at least one of the signal lines extends in a first direction, and the signal lines are coupled to the first pixel circuits of the pixels; and pixel repair structures comprising second pixel circuits, at least one first repair assembly, at least one second repair assembly, and first compensation structures, wherein the second pixel circuits and the first compensation structures are located in the non-display region, wherein the first compensation structures are coupled to the signal lines in a one-to-one correspondence and are disconnectable from their corresponding signal lines;

wherein in a direction perpendicular to a plane of the substrate, one of the at least one first repair assembly partially overlaps at least one signal line of the signal lines, and one of the at least one second repair assembly partially overlaps at least one of the light-emitting devices of the pixels; and wherein the at least one first repair assembly comprises a first repair line, the at least one second repair assembly comprises at least one second repair line, and one of the second pixel circuits comprises a first input terminal coupled to the first repair line, and an output terminal that is coupled to at least one of the at least one second repair line;

wherein at least two of the first pixel circuits are arranged in one of pixel circuit rows in a second direction, and the second direction intersects the first direction; and one of the at least one second repair assembly overlaps at least two light-emitting devices of at least two pixels of the pixels in the direction perpendicular to the plane of the substrate, wherein at least two first pixel circuits of the at least two pixels are located in one of the pixel circuit rows; and wherein the first repair line is connected to the first input terminals of at least two second pixel circuits of the second pixel circuits.

14. The display panel according to claim 13, wherein at least two of the second pixel circuits are arranged in repair circuit columns in the first direction, and the repair circuit columns are connected to the first repair line.

15. The display panel according to claim 11, wherein the first repair line is connected to one of the second pixel circuits.

16. The display panel according to claim 1, further comprising:

a second compensation structure, wherein the signal lines comprise a first signal line coupled to n1 first pixel circuits of the first pixel circuits, and a second signal line coupled to n2 first pixel circuits of the first pixel circuits, where n1 is greater than n2; and the second signal line is electrically connected to the second compensation structure.

17. The display panel according to claim 16, further comprising:

a third compensation structure electrically connected to the first signal line, wherein a capacitance value that the third compensation structure is configured to compensate is smaller than a capacitance value that the second compensation structure is configured to compensate.

18. The display panel according to claim 1, wherein the at least one signal line comprises at least two signal line, the at least two signal lines comprise a repair signal line and non-repair signal lines;

the repair signal line is not coupled to one first compensation structure of the first compensation structures that corresponds to the repair signal line, and one of the non-repair signal lines is coupled to another first compensation structure of the first compensation structures that corresponds to the non-repair signal line;

the first repair line is coupled to the repair signal line; and the second repair line is coupled to the light-emitting device of one pixel of the pixels, and the first pixel circuit of the one pixel is coupled to the repair signal line.

19. The display panel according to claim 1, wherein the signal lines are coupled to the first compensation structures in a one-to-one correspondence;

the first repair line is not coupled to the signal lines; and one of the at least one second repair line is not coupled to the at least one of the light-emitting devices that overlaps the one of the at least one second repair line.

20. The display panel according to claim 1, wherein at least two of the second pixel circuits are arranged in a repair circuit column in the first direction.

21. The display panel according to claim 1, further comprising:

a protection structure having an input terminal connected to a second constant-voltage signal line, and a signal output terminal, wherein the second constant-voltage signal line is configured to transmit a second constant-voltage signal; and in the direction perpendicular to the plane of the substrate, one of the at least one second repair line overlaps the signal output terminal.

22. The display panel according to claim 21, further comprising:

a first reset control line, a light-emitting control line, and a first power supply signal line, wherein the first pixel circuit comprises a first reset control terminal coupled to the first reset control line, a light-emitting control terminal coupled to the light-emitting control line, and a power supply signal terminal coupled to the first power supply signal line; and wherein the protection structure comprises:

a second transistor comprising a control electrode coupled to the first reset control line, a first electrode coupled to the second constant-voltage signal line, and a second electrode coupled to a first node, a third transistor comprising a control electrode coupled to the light-emitting control line, a first electrode coupled to the first node, and a second electrode overlapping one of the at least one second repair line, and a first capacitor comprising a first electrode plate coupled to the first node, and a second electrode plate coupled to the first power supply signal line.

23. The display panel according to claim 1, wherein at least two of the second pixel circuits are arranged in a same direction as the direction along which the signal lines each extend.

24. A display apparatus, comprising:

a display panel, wherein the display panel comprises:

a substrate;

a display region and a non-display region;

pixels and signal lines, wherein the signal lines are scanning lines, the pixels and the signal lines are located at a side of the substrate, at least one of the pixels comprises a first pixel circuit and a light-emitting device that are located in the display region, at least one of the signal lines extends in a first direction, and the signal lines are coupled to the first pixel circuits of the pixels; and pixel repair structures comprising second pixel circuits, at least one first repair assembly, at least one second repair assembly, and first compensation structures, wherein the second pixel circuits and the first compensation structures are located in the non-display region, and the first compensation structures comprise at least one first compensation capacitor, wherein the first compensation structures are coupled to the signal lines in a one-to-one correspondence and are disconnectable from their corresponding signal lines;

wherein in a direction perpendicular to a plane of the substrate, one of the at least one first repair assembly partially overlaps at least one signal line of the signal lines, and one of the at least one second repair assembly partially overlaps at least one of the light-emitting devices of the pixels; and wherein the at least one first repair assembly comprises a first repair line, the at least one second repair assembly comprises at least one second repair line, and one of the second pixel circuits comprises a first input terminal coupled to the first repair line, and an output terminal that is coupled to at least one of the at least one second repair line.

25. The display panel according to claim 13, wherein the first compensation structures comprise at least one first compensation capacitor.

26. The display panel according to claim 25, wherein one of the at least one first compensation capacitor comprises a first electrode plate coupled to one of the signal lines, and a second electrode plate coupled to a first constant-voltage signal line; and the first constant-voltage signal line is configured to transmit a constant-voltage signal.

27. The display panel according to claim 25, wherein one of the at least one first compensation capacitor comprises a first electrode plate and a second electrode plate; and the first electrode plate of one first compensation capacitor of the first compensation capacitors of the first compensation structures is floating, and the second electrode plate of the one first compensation capacitor is coupled to a first constant-voltage signal line configured to transmit a first constant-voltage signal.

28. The display panel according to claim 25, wherein the first compensation structures further comprise at least one dummy pixel circuit located at a side of the first compensation capacitor close to the first pixel circuit, wherein each of the at least one dummy pixel circuit is configured to not emit light and not display images.

* * * * *